(12) United States Patent
Kwon et al.

(10) Patent No.: US 11,258,044 B2
(45) Date of Patent: Feb. 22, 2022

(54) DISPLAY DEVICE HAVING PROTECTION LAYER INCLUDING PHOTO-HARDENING RESIN

(71) Applicant: Samsung Display Co., LTD., Yongin-si (KR)

(72) Inventors: Seung Wook Kwon, Hwaseong-si (KR); Woo Yong Sung, Seoul (KR); Ung-Soo Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/856,034

(22) Filed: Apr. 23, 2020

(65) Prior Publication Data

US 2020/0411795 A1    Dec. 31, 2020

(30) Foreign Application Priority Data

Jun. 26, 2019  (KR) .......................... 10-2019-0076538

(51) Int. Cl.
| | |
|---|---|
| *H01L 51/52* | (2006.01) |
| *H01L 51/00* | (2006.01) |
| *H01L 27/32* | (2006.01) |
| *H01L 51/56* | (2006.01) |

(52) U.S. Cl.
CPC ...... *H01L 51/5253* (2013.01); *H01L 27/3244* (2013.01); *H01L 51/0097* (2013.01); *H01L 51/529* (2013.01); *H01L 51/5281* (2013.01); *H01L 51/56* (2013.01);

(Continued)

(58) Field of Classification Search
CPC ............ H01L 51/5253; H01L 51/0097; H01L 51/5281; H01L 51/529; H01L 27/3244; H01L 2251/5338
See application file for complete search history.

(56) References Cited

U.S. PATENT DOCUMENTS

| | | | |
|---|---|---|---|
| 9,811,120 B2 * | 11/2017 | Namkung | ............. H05K 1/028 |
| 9,812,659 B2 | 11/2017 | Kwon et al. | |
| 10,198,974 B2 * | 2/2019 | Yun | ..................... H01L 27/3244 |

(Continued)

FOREIGN PATENT DOCUMENTS

| | | |
|---|---|---|
| KR | 1020160042298 A | 4/2016 |
| KR | 1020170040864 A | 4/2017 |

(Continued)

*Primary Examiner* — Ida M Soward
(74) *Attorney, Agent, or Firm* — Cantor Colburn LLP

(57) ABSTRACT

A display device includes: a substrate including a first flat area, a second flat area, and a bending area between the first flat area and the second flat area; a display unit overlapping the first flat area and disposed on a surface of the substrate; first and second protection layers on an opposing surface of the substrate and overlapping the first and second flat areas, respectively. The first and second protection layers include a hardening member including a photo-hardening resin, the first protection layer includes a first inclination part at an end, the second protection layer includes a second inclination part at an end, the first inclination part has a first inclination angle with the opposing surface, the second inclination part has a second inclination angle with the opposing surface, and the first and second inclination angles are in a range of about 10 degrees to about 90 degrees.

18 Claims, 16 Drawing Sheets

(52) U.S. Cl.
CPC ... *G09G 2330/04* (2013.01); *G09G 2330/045* (2013.01); *H01L 2251/5338* (2013.01)

(56) References Cited

U.S. PATENT DOCUMENTS

| | | | |
|---|---|---|---|
| 10,700,311 B2* | 6/2020 | Kwon | H01L 51/5253 |
| 10,727,440 B2* | 7/2020 | Kim | H01L 51/56 |
| 10,901,464 B2* | 1/2021 | Seo | G06F 1/1681 |
| 10,921,856 B2* | 2/2021 | Han | G06F 1/1641 |
| 11,094,916 B2* | 8/2021 | Jeong | H01L 51/56 |
| 2015/0146386 A1* | 5/2015 | Namkung | G02F 1/133305 361/749 |
| 2018/0013095 A1* | 1/2018 | Choi | H01L 51/0097 |
| 2018/0226611 A1* | 8/2018 | Andou | H01L 51/56 |
| 2021/0184139 A1* | 6/2021 | Zhang | H01L 51/0097 |

FOREIGN PATENT DOCUMENTS

| | | |
|---|---|---|
| KR | 1020170139176 A | 12/2017 |
| KR | 1020180074891 A | 7/2018 |

\* cited by examiner

DISPLAY DEVICE HAVING PROTECTION LAYER INCLUDING PHOTO-HARDENING RESIN

This application claims priority to Korean Patent Application No. 10-2019-0076538, filed on Jun. 26, 2019, and all the benefits accruing therefrom under 35 U.S.C. § 119, the content of which in its entirety is herein incorporated by reference.

BACKGROUND

(a) Field

The disclosure relates to a display device and a manufacturing method of the display device.

(b) Description of the Related Art

Display devices such as liquid crystal displays and organic light emitting devices may be manufactured by forming various layers and elements on a substrate.

A glass substrate may be used as the substrate of the display device, but to glass substrate is typically heavy and fragile. In addition, since the glass substrate has a hard property, it may be difficult to deform the display device.

Recently, a display device using a substrate having flexible, lightweight, impact-resistant, and easily deformable properties has been developed. The display device using the flexible substrate may be designed to bend the edge of a display panel with a pad portion, and thus a dead space may be reduced compared to the display device using the substrate having the rigid property such as a glass substrate.

SUMMARY

Exemplary embodiments relate to a display device and a manufacturing method thereof for simplifying a process by selectively patterning a protection layer on a surface of a substrate and for easy bending by forming an end of the protection layer to be inclined.

According to an exemplary embodiment, a display device includes: a substrate including a first flat area, a second flat area, and a bending area disposed between the first flat area and the second flat area; a display unit overlapping the first flat area and disposed on a surface of the substrate; a first protection layer disposed on an opposing surface of the substrate, which is opposite to the surface of the substrate, and overlapping the first flat area; and a second protection layer disposed on the opposing surface of the substrate and overlapping the second flat area, where the first protection layer and the second protection layer include a hardening member including a photo-hardening resin, the first protection layer includes a first inclination part at an end thereof, the second protection layer includes a second inclination part at an end thereof, the first inclination part has a first inclination angle with the opposing surface of the substrate, the second inclination part has a second inclination angle with the opposing surface of the substrate, and each of the first inclination angle and the second inclination angle is greater than or equal to about 10 degrees and less than or equal to about 90 degrees.

In an exemplary embodiment, the first inclination angle and the second inclination angle may be in a range of about 30 degrees to about 45 degrees.

In an exemplary embodiment, as the first inclination angle and the second inclination angle decrease, a strain received by the substrate at the bending area may decrease.

In an exemplary embodiment, a maximum value of the strain may be about 1.4% during bending of the display device, and a value of the strain is defined as: (strain length)/(initial length)×100(%).

In an exemplary embodiment, the first inclination part may be disposed at a part where the first flat area is adjacent to the bending area, and the second inclination part may be disposed at a part where the second flat area is adjacent to the bending area.

In an exemplary embodiment, the photo-hardening resin may include at least one material selected from an acrylate-based compound including an acrylate-based polymer, a polyurethane and SiO, and the photo-hardening resin may further include at least one material selected from an acryl-based resin, a butyl rubber, a vinyl acetate resin, an ethylene vinyl acetate ("EVA") resin, a natural rubber, nitriles, a silicate resin, a silicone rubber, and a styrene block polymer.

In an exemplary embodiment, each of the first protection layer and the second protection layer may include a first auxiliary layer, a second auxiliary layer and a third auxiliary layer, which are sequentially stacked one on another from the opposing surface of the substrate.

In an exemplary embodiment, the third auxiliary layer may include a heat dissipating material having heat conductivity.

In an exemplary embodiment, the heat dissipating material may be a carbon composite material including at least one selected from graphite, a carbon nanotube ("CNT"), a carbon fiber, and graphene.

In an exemplary embodiment, the third auxiliary layer may further include a dispersant including a dispersion photo-hardening resin.

In an exemplary embodiment, the first auxiliary layer may include at least one material selected from an acryl-based resin, a butyl rubber, a vinyl acetate resin, an EVA resin, a natural rubber, nitriles, a silicate resin, a silicone rubber and a styrene block polymer, and the second auxiliary layer may include at least one material selected from acrylate-based compounds including an acrylate-based polymer, polyurethane and SiO.

In an exemplary embodiment, a connection part may be disposed on the opposing surface of the substrate at the bending area, and the connection part may include a same material as the second auxiliary layer.

In an exemplary embodiment, the first protection layer and the second protection layer may be spaced apart from each other, and a space between the first protection layer and the second protection layer may overlap the bending area.

In an exemplary embodiment, the display device may further include a polarization layer disposed on the display unit, the display device may further include a driving unit overlapping the second flat area and disposed on the surface of the substrate, the first protection layer may overlap the display unit and the polarization layer, and the second protection layer may overlap the driving unit.

According to an exemplary embodiment, a display device includes: a substrate including a first flat area, a second flat area, and a bending area disposed between the first flat area and the second flat area; a display unit overlapping the first flat area and disposed on a surface of the substrate; a first protection layer disposed on an opposing surface of the substrate, which is opposite to the surface of the substrate, and overlapping the first flat area; and a second protection layer disposed on the opposing surface of the substrate and overlapping the second flat area, where the first protection layer and the second protection layer include a hardening member including a photo-hardening resin, the first protection layer includes a first inclination part having a first inclination angle at an end thereof, the second protection layer includes a second inclination part having a second inclination angle at an end thereof, and the first protection layer and the second protection layer include a heat dissipating material having heat conductivity.

In an exemplary embodiment, the first inclination angle and the second inclination angle may be greater than or equal to about 10 degrees and less than or equal to about 90 degrees.

In an exemplary embodiment, the heat dissipating material may be a carbon composite material including at least one material selected from graphite, a CNT, a carbon fiber, and graphene.

In an exemplary embodiment, the first protection layer and the second protection layer may further include a dispersant including a dispersion photo-hardening resin.

In an exemplary embodiment, a manufacturing method of a display device includes: providing a display unit including a plurality of thin film transistors on one surface of a substrate; and coating and curing a photo-hardening resin on the opposing surface of the substrate overlapping one surface of the substrate to form a first protection layer and a second protection layer, wherein the photo-hardening resin is coated through an Inkjet process.

In an exemplary embodiment, the coating of the photo-hardening resin may include coating the photo-hardening resin by a printing device including a nozzle, the nozzle may discharge droplets of the photo-hardening resin, the display device may include a first flat area in which the display unit is provided, a bending area adjacent to the first flat area, and a second flat area adjacent to the bending area, and the nozzle may discharge fewer droplets of the photo-hardening resin from the first flat area toward the bending area and may discharge fewer droplets of the photo-hardening resin from the second flat area toward the bending area.

According to exemplary embodiments, by selectively patterning the protection layer, the process may be simplified to provide the display device and the manufacturing method thereof.

According to exemplary embodiments, by forming the end of the protection layer to be inclined, it is possible to effectively control the strain received by the substrate during bending, and to thereby provide the display device capable of easy bending and the manufacturing method thereof.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
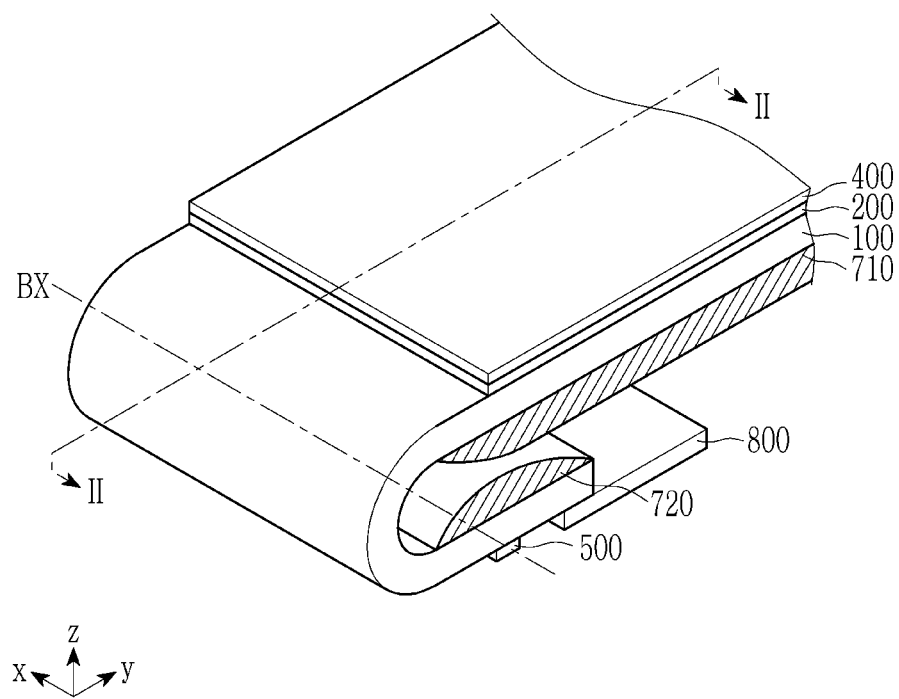
FIG. 1 is a perspective view schematically showing a part of a display device according to an exemplary embodiment.

The invention will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

Further, in the drawings, a size and thickness of each element are arbitrarily represented for better understanding and ease of description, and the present invention is not limited thereto. In the drawings, the thickness of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, in the specification, the phrase "on a plane" means viewing the object portion from a top, and the phrase "on a cross-section" means viewing a cross-section of which the object portion is vertically cut from the side.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Now, a display device according to an exemplary embodiment will be described with reference to FIG. 1 to FIG. 3. FIG. 1 is a perspective view schematically showing a part of a display device according to an exemplary embodiment, FIG. 2 is a cross-sectional view taken along line II-II of FIG. 1, and FIG. 3 is a cross-sectional view showing a portion of the display device of FIG. 2 in a state in which a substrate is unfolded.

Figure 2:
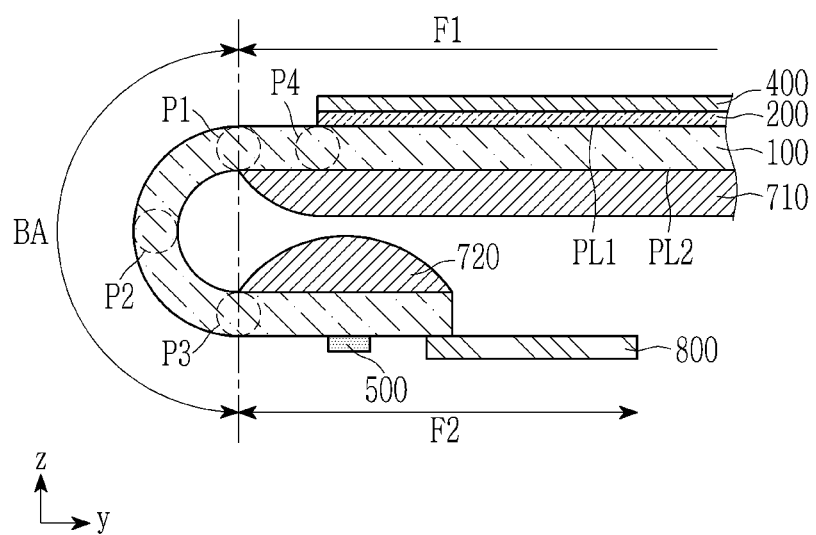
FIG. 2 is a cross-sectional view taken along line II-II of FIG. 1.
Figure 3:
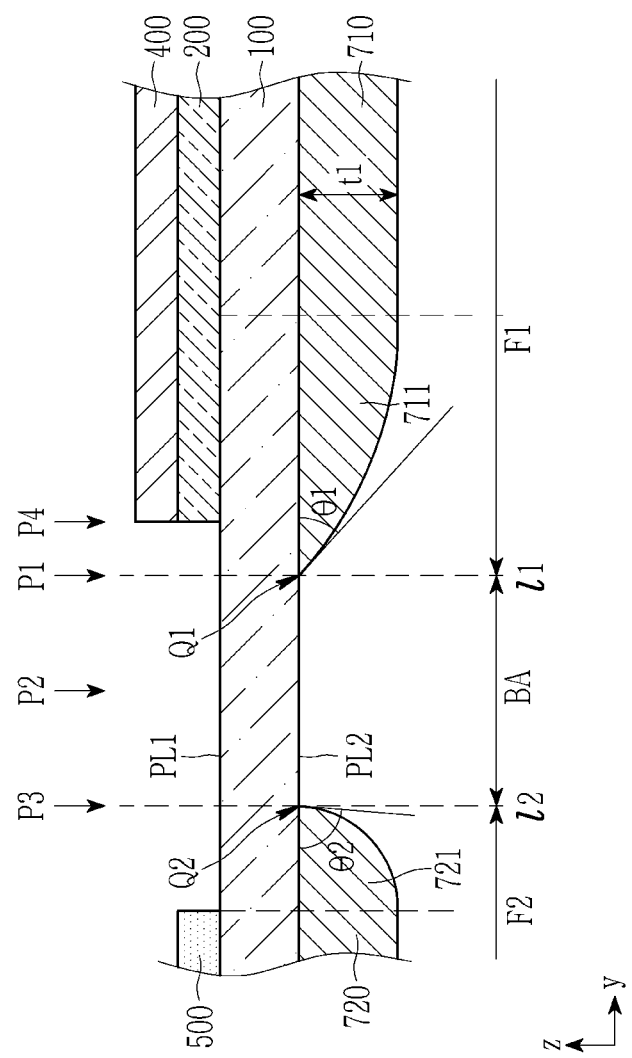
FIG. 3 is a cross-sectional view showing a portion of the display device of FIG. 2 in a state in which a substrate is unfolded.

In an exemplary embodiment of the display device, a part of a substrate 100 is bent or folded as shown in FIG. 1 and FIG. 2.

The substrate 100 may include at least one of various materials having a flexible or bendable characteristic. In one exemplary embodiment, for example, the substrate 100 may include a polymer resin such as polyethersulphone ("PES"), polyacrylate ("PAR"), polyetherimide ("PEI"), polyethylene naphthalate, ("PEN"), polyethylene terephthalate ("PET"), polyphenylene sulfide ("PPS"), polyarylate, polyimide ("PI"), polycarbonate ("PC"), cellulose acetate propionate ("CAP"), or the like.

The substrate 100 includes a first flat area F1 and a second flat area F2, and a bending area BA disposed between the first flat area F1 and the second flat area F2. The substrate 100 may include a bending area BA that is bent with respect to a bending axis BX parallel to an extending direction of an x-axis. Herein, a z-axis may be an axis in a direction parallel to a thickness direction of the substrate 100, and the x-axis may be an axis in a direction parallel to a width or length direction of the substrate 100, and a y-axis may be an axis in a direction perpendicular to the x-axis and the z-axis.

The first flat area F1 of the substrate 100 overlaps a display unit 200 and a polarization layer 400. In an exemplary embodiment, the first flat area F1 may include a partial area outside the display unit 200 as shown in FIG. 2, but not being limited thereto. The display unit 200 and the polarization layer 400 are disposed on one surface of the substrate, and hereinafter, the one surface on which the display unit 200 and the polarization layer 400 are disposed is referred to as a first surface PL1. FIG. 1 to FIG. 3 show that the edges of the display unit 200 and the polarization layer 400 coincide (or aligned) with each other, but not being limited thereto. Alternatively, the edges of the display unit 200 and the polarization layer 400 may not coincide with each other.

The display unit 200 may include a plurality of thin film transistors and a light-emitting element connected thereto, which will be described later in detail with reference to FIG. 16. Herein, for convenience of description, exemplary embodiments in which the display unit 200 includes the light-emitting element, but not being limited thereto. Alternatively, the display unit 200 includes may include another type of light emitting or control element, e.g., a liquid crystal element.

Although not shown in the drawings, an exemplary embodiment of the display device may further include a touch unit (not shown) disposed between the display unit 200 and the polarization layer 400. The touch unit may acquire coordinate information by detecting external touch information and generates an input signal corresponding thereto. The touch unit may be provided as a separate unit to be mounted on the display unit 200, or may be directly formed on the display unit 200 to be embedded therein.

The polarization layer 400 may be disposed on the display unit 200. The polarization layer 400 may reduce external light reflection. When external light passes through the polarization layer 400 and is reflected by the display unit 200 and then passes through the polarization layer 400 again, the phase of the external light may be changed. As a result, the phase of the reflected light and the phase of the external light entering the polarization layer 400 are different, and thus destructive interference may occur between the reflected light and the external light.

In an exemplary embodiment, an adhesive layer (not shown) may be disposed between the polarization layer 400 and the display unit 200. The adhesive layer may be a transparent adhesive layer. In one exemplary embodiment, for example, the adhesive layer may include an optically clear adhesive ("OCA"), an optically clear resin ("OCR"), or a pressure sensitive adhesive ("PSA").

The second flat area F2 and the bending area BA may include a non-display area corresponding to an outer or peripheral part of the display unit 200.

A driving unit 500 may be disposed in the second flat area F2 of the substrate 100. The driving unit may be disposed on the first surface PL1 of the substrate. The driving unit 500 may be connected to a pad unit disposed on the substrate 100 to supply a data signal and a gate signal (hereinafter, collectively referred to 'a signal') to a gate line and a data line. In an exemplary embodiment, the driving unit 500 may be a driver integrated circuit ("IC"), and may be disposed or mounted on a pad unit of the substrate 100. In such an embodiment, the pad unit may be directly electrically connected to the driver IC.

In an exemplary embodiment, a flexible circuit board 800 may be connected with the pad unit of the substrate 100 and an IC may be mounted on the flexible circuit board 800. The flexible circuit board may be disposed on the first surface PL1 of the substrate. The flexible circuit board 800 may be applied with a chip on film ("COF"), a chip on plastic ("COP"), or a flexible printed circuit ("FPC"), and the IC may be disposed or mounted on the flexible circuit board 800 to supply a signal to the display unit 200.

Protection layers 710 and 720 may be disposed on a rear surface of the substrate 100. The rear surface of the substrate 100, where the protection layers 710 and 720 are disposed, is another surface of the substrate 100 opposite to the first surface PL1 on which the display unit 200 is disposed. Hereinafter, the other surface of the substrate 100 will be referred to as a second surface PL2. In such an embodiment, the protection layers 710 and 720 are disposed on the second surface PL2 of the substrate 100.

In an exemplary embodiment, the display device may include a first protection layer 710 overlapping the first flat area F1 on the second surface PL2 of the substrate 100 and a second protection layer 720 overlapping the second flat area F2 on the second surface PL2 of the substrate 100.

An empty space defined between the first protection layer 710 and the second protection layer 720 may overlap the bending area BA. In such an embodiment, no layer may be disposed on the second surface PL2 of the substrate 100 corresponding to the bending area BA.

The first protection layer 710 may overlap the first flat area F1 and may also overlap the display unit 200 and the polarization layer 400. The first protection layer 710 may be in direct contact with the substrate 100.

In an exemplary embodiment, the first protection layer 710 has a first inclination part 711 at an end thereof where the first flat area F1 is adjacent to the bending area BA. In such an embodiment, the end of the first protection layer 710 may be formed to be inclined. Although not shown in FIG. 1 to FIG. 3, the first protection layer 710 may also have an inclination part at an end opposite to the end having the first inclination part 711.

In such an embodiment, as the end portion of the first protection layer 710 may be formed to be inclined, the space in the bending area BA may be effectively secured during bending. In such an embodiment, by controlling the angle of the first inclination part 711 of the first protection layer 710, a strain applied to the substrate 100 in the bending area BA may be effectively controlled or reduced, thereby facilitating the bending.

The first inclination part 711 of the first protection layer 710 may have a shape that is inclined toward the second surface PL2 of the substrate 100. The first inclination part 711 of the first protection layer 710 may become thinner toward the end. The first inclination part 711 may have a cross-section of a smooth shape. Accordingly, the first protection layer 710 may have the smooth shape without any protruded part.

Referring to FIG. 3, in an exemplary embodiment, the outermost point where the first inclination part 711 of the first protection layer 710 meets the second surface PL2 of the substrate 100 is referred to as a first contact point Q1. That is, the edge of the first protection layer 710 is at the first contact point Q1. In FIG. 3, the first contact point Q1 is shown as one point, but referring to FIG. 1, as the first contact point Q1 may define a straight line substantially parallel to the bending axis BX.

In FIG. 3, a straight line perpendicular to the substrate 100 at the first contact point Q1 is referred to as a first straight line 11, which is an imaginary line. The first inclination part 711 of the first protection layer 710 has a first inclination angle $\theta 1$. The first inclination angle $\theta 1$ is the angle between the first inclination part 711 and the substrate 100 at the first contact point Q1.

The first inclination angle $\theta 1$ has a value greater than about 10 degrees and less than about 90 degrees, and the strain of the substrate 100 when bending in the corresponding range may be substantially reduced. In one exemplary embodiment, for example, the first inclination angle $\theta 1$ may be in a range of about 30 degrees to about 45 degrees, and the decreasing degree of the strain received by the substrate 100 is maximized when bending in the corresponding range, thereby allowing the stable and effective bending of the substrate 100.

In an exemplary embodiment, the second protection layer 720 may overlap the second flat area F2, and may overlap a portion of the driving unit 500 and the flexible circuit board 800.

The second protection layer 720 has a second inclination part 721 at an end thereof where the second flat area F2 is adjacent to the bending area BA. The second protection layer 720 may have an inclination part at an end opposite to the end of the second inclination part 721. That is, the second protection layer 720 may have the inclination part even in the part where the substrate 100 overlaps the flexible circuit board 800.

In an exemplary embodiment, as described above, the end of the second protection layer 720 may be formed to be inclined, thereby effectively securing a space in the bending area BA during bending. In such an embodiment, by adjusting the angle of the second inclination part 721 of the second protection layer 720, the strain received by the substrate 100 in the bending area BA may be effectively controlled or reduced, thereby facilitating the bending.

The second inclination part 721 of the second protection layer 720 may have a shape that is inclined toward the second surface PL2 of the substrate 100. The second inclination part 721 of the second protection layer 720 may have a thickness that becomes thinner toward the end. The second inclination part 721 may have a cross-section of a smooth shape. Accordingly, the second protection layer 720 may have a smooth shape without any protruded part.

Referring to FIG. 3, the outermost point where the second inclination part 721 of the second protection layer 720 meets the second surface PL2 of the substrate 100 is referred to as a second contact point Q2. That is, the edge of the second protection layer 720 is at the second contact point Q2. In FIG. 3, the second contact point Q2 is shown as one point, but referring to FIG. 1, the second contact point Q2 may define a straight line substantially parallel to the bending axis BX.

In FIG. 3, a straight line perpendicular to the substrate 100 at the second contact point Q2 is referred to as a second straight line 12, which is an imaginary line. The second inclination part 721 of the second protection layer 720 has a second inclination angle θ2. The second inclination angle θ2 is the angle between the second inclination part 721 and the substrate 100 at the second contact point Q2.

The second inclination angle θ2 has a value greater than about 10 degrees and less than about 90 degrees, and the strain of the substrate 100 when bending in the corresponding range may be substantially reduced. In one exemplary embodiment, for example, the second inclination angle θ2 may be in a range of about 30 degrees to about 45 degrees, and the decreasing degree of the strain received by the substrate 100 is maximized when bending in the corresponding range, thereby facilitating the stable and free bending of the substrate 100.

The first inclination angle θ1 and the second inclination angle θ2 may be different from each other or may be the same as each other.

Referring to FIG. 3 along with FIG. 2, four parts P1, P2, P3, and P4 are defined in the substrate 100.

First, the first part P1, the second part P2, and the third part P3 on the bending area BA side will be described. The boundary part where the bending area BA of the substrate 100 and the first flat area F1 meet is referred to as a first part P1. The boundary part where the bending area BA of the substrate 100 and the second flat area F2 meet is referred to as a third part P3. In the bending area BA of the substrate 100, the part disposed between the first part P1 and the third part P3 is referred to as a second part P2. The second part P2 may be the middle part of the bending area BA, but the position of the second part P2 is not limited in the bending area BA.

The second part P2 is an area corresponding to the space between the first protection layer 710 and the second protection layer 720, and no constituent elements may be positioned on the second surface PL2 of the second part P2 of the substrate 100.

Referring to FIG. 3, the first part P1 of the substrate 100 may be disposed on the first straight line 11 that is the boundary of the first flat area F1 and the bending area BA. The third part P3 of the substrate 100 may be disposed on the second straight line 12 which is the boundary between the second flat area F2 and the bending area BA. That is, the first part P1 may overlap the first straight line 11 and the third part P3 may overlap the second straight line 12.

As shown in FIG. 2 and FIG. 3, the boundary part where the substrate 100 meets the display unit 200 and the polarization layer 400 is referred to as a fourth part P4. According to an alternative exemplary embodiment, the edges of the display unit 200 and the polarization layer 400 may not coincide. In such an embodiment, the fourth part P4 may be a boundary part of the substrate that meets (or overlaps an edge of) either one of the display unit 200 and the polarization layer 400.

The first part P1, the second part P2, the third part P3, and the fourth part P4 of the substrate 100 receive the stress when being bent from the unfolded state of FIG. 3 to the bending state of FIG. 2 and then the deformation occurs. In such an embodiment, the display device includes the inclination parts 711 and 721 on the end of the protection layers 710 and 720, such that the interference in the bending area BA may be minimized. In such an embodiment, by controlling (e.g., setting to a predetermined value of) the inclination angles θ1 and θ2 of the inclination parts 711 and 721, the strain of the substrate 100 is effectively controlled when bending, thereby allowing stable and easy bending of the substrate 100.

The strain received when each part of the substrate 100 is bent will be described later in detail with reference to FIG. 4 and FIG. 5.

The first protection layer 710 is a layer formed by curing a photo-hardening resin coated through a printing process, for example, an Inkjet process. In the process of curing the photo-hardening resin, the first inclination part 711 of the first protection layer 710 may be tapered toward the substrate 100. The process of forming the first protection layer 710 will be described later in detail with reference to FIG. 17 and FIG. 18.

Next, a material included in the protection layers 710 and 720 will be described.

The first protection layer 710 may be formed using a photo-hardening resin. The photo-hardening resin may include at least one material selected from acrylate-based compounds, including acrylate-based polymer, polyurethane, and SiO, but not being limited thereto. In such an embodiment, the first protection layer 710 may include any conventional material that forms a photo-hardening resin. In one exemplary embodiment, for example, the photo-hardening resin may further include a photoinitiator, a heat stabilizer, an antioxidant, an antistatic agent, or a slip agent.

In an exemplary embodiment, the photo-hardening resin may further include at least one material selected from an acryl-based resin, a butyl rubber, a vinyl acetate resin, an ethylene vinyl acetate ("EVA") resin, a natural rubber, nitriles, a silicate resin, a silicone rubber, and a styrene block polymer. In such an embodiment, where the photo-hardening resin further includes at least one material selected from the above-described materials, the photo-hardening resin may have improved adhesive strength.

The first protection layer 710 may include a hardening member of the photo-hardening resin described above. That is, the first protection layer 710 may include a hardening member including at least one material selected from the acrylate-based compounds including an acrylate-based polymer, polyurethane, and SiO. In an exemplary embodiment, the first protection layer 710 may further include the photoinitiator, the thermal stabilizer, the antioxidant, the antistatic agent or the slip agent, which remain in the first protection layer 710 after the photo-hardening resin is cured.

The first protection layer 710 may also include at least one material selected from an acryl-based resin, butyl rubber, a vinyl acetate resin, an EVA resin, a natural rubber, nitriles, a silicate resin, a silicone rubber, and a styrene block polymer. In such an embodiment, where the first protection layer 710 further includes at least one material selected from the above-described materials, the first protection layer 710 may have improved adhesive strength, e.g., an adhesive strength in a range of about 10 gram-force per square inch ($gf/in^2$) to about 50 $gf/in^2$.

The maximum thickness t1 of the first protection layer 710 may be in a range of about 75 micrometers (μm) to about 100 μm. If the maximum thickness t1 of the first protection layer 710 is less than about 75 μm, it may be difficult to protect the substrate 100 and the display unit 200 with the first protection layer 710 alone. If the maximum thickness t1 of the first protection layer 710 is greater than about 100 μm, the thickness of the display device may be excessively increased, thereby causing an overgrowth.

The second protection layer 720 is a layer formed by curing the photo-hardening resin coated through the printing process, for example, the Inkjet process. In the process of curing the photo-hardening resin, the second inclination part 721 of the second protection layer 720 may be tapered toward the substrate 100. The process of forming the second protection layer 720 will be described later in greater detail with reference to FIG. 17 and FIG. 18.

In an exemplary embodiment, the second protection layer 720 may be formed using the photo-hardening resin. The photo-hardening resin may include at least one material selected from acrylate-based compounds including acrylate-based polymers, polyurethane and SiO, or may include any conventional material that forms the photo-hardening resin without being limited thereto. In one exemplary embodiment, for example, the photo-hardening resin may further include the photoinitiator, the heat stabilizer, the antioxidant, the antistatic agent, or the slip agent.

In an exemplary embodiment, the photo-hardening resin may further include at least one material selected from the acryl-based resin, the butyl rubber, the vinyl acetate resin, the EVA resin, the natural rubber, the nitriles, the silicate resin, the silicone rubber, and the styrene block polymer. In such an embodiment, where the photo-hardening resin further includes at least one material selected form the above-described materials, the photo-hardening resin may have improved adhesion. In such an embodiment, the adhesive strength of the second protection layer 720 may be in a range of about 10 $gf/in^2$ to about 50 $gf/in^2$.

In such an embodiment, where the second protection layer 720 has a predetermined adhesive strength, it may be easy to adhere a lower protective film on the second protection layer 720 in the manufacturing process. The lower protective film may effectively prevent an impurity from inflowing into the display device or scratches during the manufacturing process.

The second protection layer 720 may include the hardening member of the photo-hardening resin described above. The second protection layer 720 may include an hardening member including at least one material selected from the acrylate-based compounds including an acrylate-based polymer, polyurethane, and SiO. In an exemplary embodiment, the second protection layer 720 may further include the photoinitiator, the thermal stabilizer, the antioxidant, the antistatic agent or the slip agent, for example, remaining in the second protection layer 720 after the photo-hardening resin is cured.

In an exemplary embodiment, the second protection layer 720 may further include at least one material selected from the acryl-based resin, the butyl rubber, the vinyl acetate resin, the EVA resin, the natural rubber, the nitriles, the silicic acid resin, the silicone rubber, and the styrene block polymer according to exemplary embodiments. In such an embodiment, where the second protection layer 720 further includes at least one material selected from the above-described materials, the second protection layer 720 may have improved adhesive strength.

According to an exemplary embodiment, by coating and curing the photo-hardening resin by the printing process (for example, the Inkjet process) to form the first protection layer 710 and the second protection layer 720, it is easy to form the pattern so that the protection layers 710 and 720 are not disposed in the bending area BA of the substrate 100. In such an embodiment, the protection layers 710 and 720 may be easily provided without a separate adhesive layer.

In such an embodiment, by smoothing the inclination of each end of the first protection layer 710 and the second protection layer 720, the interference between the two protection layers 710 and 720 during bending may be minimized and the stress applied to the substrate 100 during bending may be easily adjusted.

Hereinafter, the strain when the substrate 100 is bent will be described with reference to FIG. 4 and FIG. 5 along with FIG. 1 to FIG. 3 described above. FIG. 4 is a graph showing a strain depending on an inclination angle in a first part P1 and a second part P2 of FIG. 2, and FIG. 5 is a graph showing a strain depending on an inclination angle in a third part P3 and a fourth part P4 of FIG. 2.

Figure 4:
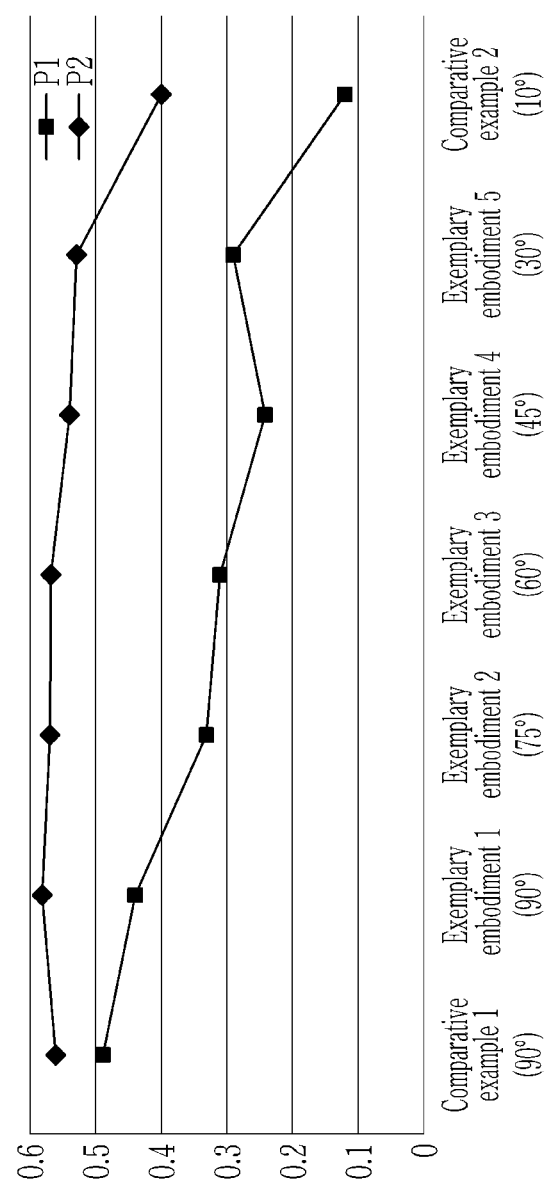
FIG. 4 is a graph showing a strain depending on an inclination angle in a first part and a second part of FIG. 2.
Figure 5:
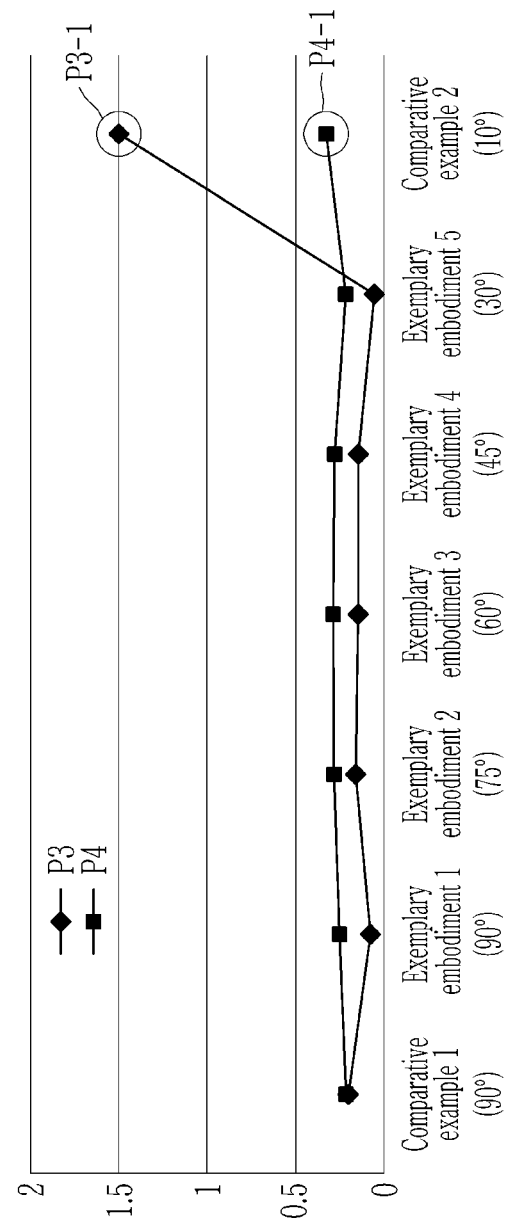
FIG. 5 is a graph showing a strain depending on an inclination angle in a third part and a fourth part of FIG. 2.

In FIG. 4 and FIG. 5, a horizontal axis represents comparative examples and exemplary embodiments by differentiating the material of the protection layers 710 and 720 and the inclination angle of the protection layers 710 and 720, and a vertical axis represents the strain.

In FIG. 4 and FIG. 5, Comparative Example 1 is a case where the protection layers 710 and 720 are a PET film in which the photo-hardening resin are not included, and the inclination angle of the protection layers 710 and 720 is about 90 degrees. Exemplary Embodiment 1, Exemplary Embodiment 2, Exemplary Embodiment 3, Exemplary Embodiment 4, Exemplary Embodiment 5, and Comparative Example 2 are each a case in which the protection layers 710 and 720 include the photo-hardening resin. Exemplary Embodiment 1 to Exemplary Embodiment 5, and Comparative Example 2 are cases in which the inclination angle of the inclination parts 711 and 721 of the protection layers 710 and 720 are 90 degrees, 75 degrees, 60 degrees, 45 degrees, 30 degrees, and 10 degrees, respectively.

Next, FIG. 4 and FIG. 5 will be described with reference to Table 1 below. Each value in Table 1 represents the strain in each part of the substrate 100. Hereinafter, the strain represents "(strain length)/(initial length)×100" in each part of the substrate 100, and a unit thereof is %.

In the experimental example of Table 1, the maximum strain capable of functioning as the display device is set to be 1.4%. That is, when the strain exceeds 1.4%, the damage may occur in the light-emitting elements or the wiring, and the stable bending is difficult, which may cause a defect in the display device. In the case of Comparative Example 2 to be described later, for example, the third part P3 receives the strain of 1.5%, and thus it may be difficult to be used for a display device including a bended part.

TABLE 1

|    | Comparative Example 1 90 degrees | Exemplary Embodiment 1 90 degrees | Exemplary Embodiment 2 75 degrees | Exemplary Embodiment 3 60 degrees | Exemplary Embodiment 4 45 degrees | Exemplary Embodiment 5 30 degrees | Comparative Example 2 10 degrees |
|----|------|------|------|------|------|------|------|
| P1 | 0.49 | 0.44 | 0.33 | 0.31 | 0.24 | 0.29 | 0.12 |
| P2 | 0.56 | 0.58 | 0.57 | 0.57 | 0.54 | 0.53 | 0.4  |
| P3 | 0.19 | 0.07 | 0.16 | 0.15 | 0.15 | 0.06 | 1.5  |
| P4 | 0.21 | 0.25 | 0.29 | 0.29 | 0.28 | 0.22 | 0.32 |

The strain applied to the first part P1 and the second part P2 of the substrate 100 when bending will hereinafter be described with reference to FIG. 4.

The first part P1 of the substrate 100 has strain of 0.49%, 0.44%, 0.33%, 0.31%, 0.24%, 0.29%, and 0.12% in order of Comparative Example 1, Exemplary Embodiment 1 to Exemplary Embodiment 5, and Comparative Example 2. That is, the strain applied to the first part P1 decreases in the order of Comparative Example 1, Exemplary Embodiment 1 to Exemplary Embodiment 5, and Comparative Example 2. As described above, when using the photo-hardening resin as the protection layers 710 and 720 of the rear surface of the substrate 100 (the second surface PL2) as in Exemplary Embodiment 1 to Exemplary Embodiment 5 and Comparative Example 2, the strain of the first part P1 may be reduced.

The second part P2 of the substrate 100 has strain of 0.56%, 0.58%, 0.57%, 0.57%, 0.54%, 0.53%, and 0.40% in the order of Comparative Example 1, Exemplary Embodiment 1 to Exemplary Embodiment 5, and Comparative Example 2. That is, the strain received by the second part P2 generally decreases in the order of Exemplary Embodiment 1 to Exemplary Embodiment 5, and Comparative Example 2. As in Exemplary Embodiment 1 to Exemplary Embodiment 5 and Comparative Example 2, the protection layers 710 and 720 of the rear surface of the substrate 100 include the photo-hardening resin and the inclination angles $\theta 1$ and $\theta 2$ of the inclination parts 711 and 721 of the protection layers 710 and 720 decrease, so the strain of the second part P2 may be reduced.

The difference between the second part P2 and the first part P1 will now be described. In Exemplary Embodiment 1, compared with Comparative Example 1, the strain of the second part P2 is increased from 0.56% to 0.58%. However, the second part P2 is the part corresponding to the empty space between two protection layers 710 and 720 disposed on the second surface PL2 of the substrate 100, and the increase of the strain may not affect the light-emitting element, the signal wires, or the like.

Figure 6:
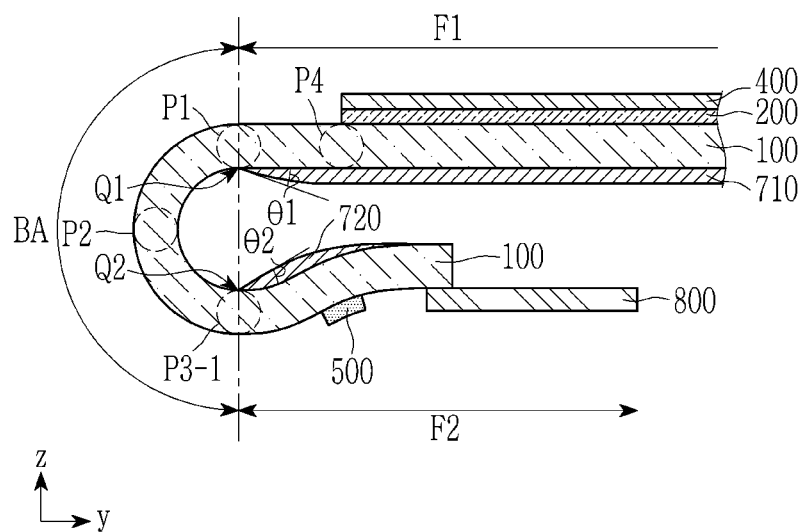
FIG. 6 is a cross-sectional view of a display device according to a comparative example of FIG. 5.
Figure 7:
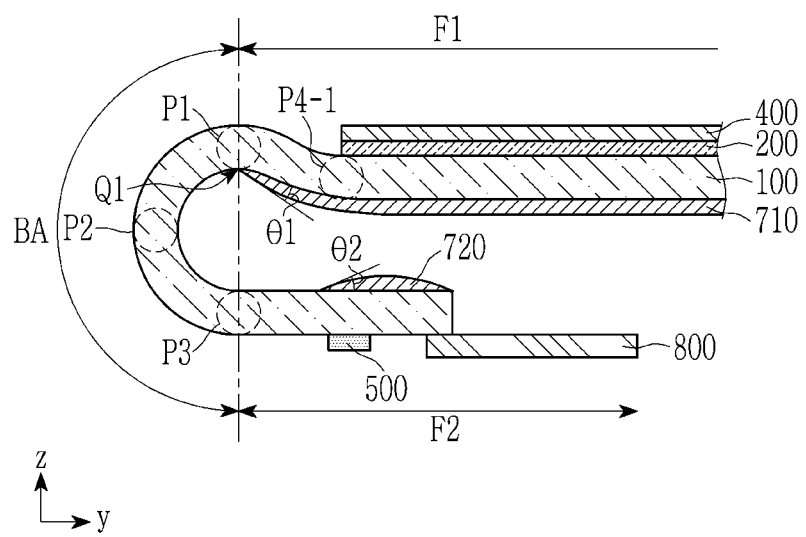
FIG. 7 is a cross-sectional view of a display device according to a comparative example of FIG. 5.

Next, the strain applied to the third part P3 and the fourth part P4 of the substrate 100 when the protection layers 710 and 720 have a specific angle will be described with reference to FIG. 5 along with FIG. 6 and FIG. 7. FIG. 6 is a cross-sectional view showing the comparative example of FIG. 5, particularly the display device including the first third part P3-1, and FIG. 7 is a cross-sectional view showing the comparative example of FIG. 5, particularly the display device including the first fourth part P4-1.

Referring back to FIG. 5 along with Table 1, the third part P3 of the substrate 100 has each strain of 0.19%, 0.07%, 0.16%, 0.15%, 0.15%, 0.06%, and 1.5% in the order of Comparative Example 1, Exemplary Embodiment 1 to Exemplary Embodiment 5, and Comparative Example 2. In the case of Comparative Example 1 and Exemplary Embodiment 1 to Exemplary Embodiment 5, the variation of the strain received by the third part P3 is not substantially great.

In contrast, in the case of Comparative Example 2 where the inclination angles $\theta 1$ and $\theta 2$ of the protection layers 710 and 720 were about 10 degrees, the strain received by the third part P3 increases by 1.5% compared to Comparative Example 1 and Exemplary Embodiment 1 to Exemplary Embodiment 5. Hereinafter, the third part P3 of Comparative Example 2 in FIG. 5 is referred to as a first third part P3-1.

Next, the bending state of the display device, particularly the first third part P3-1 according to Comparative Example 2, will be described with reference to FIG. 6. FIG. 6 shows the bending state of the display device in which the second inclination angle $\theta 2$ of the second protection layer 720 is about 10 degrees. Hereinafter, any repetitive detailed description of the same or like constituent elements as the constituent elements described above with reference to FIG. 1 to FIG. 3 will be omitted.

Referring to FIG. 6, as the strain received by the first third part P3-1 of the substrate 100 is rapidly increased to 1.5% as shown in FIG. 5, the substrate 100 may be struck down compared to the case shown in FIG. 2 around first third part P3-1. That is, when the second inclination angle $\theta 2$ of the second protection layer 720 is about 10 degrees, the second flat area F2 may not be maintained in a flat shape and may be lower in the z-axis direction than the horizontal position of the flexible circuit board 800. The bending area BA part adjacent to the second flat area F2 may also be struck down along with the second flat area F2.

In an exemplary embodiment of the display device of FIG. 2, both the first flat area F1 and the second flat area F2 may be effectively maintained in the flat state, thereby ensuring the stability even when the display device is bent.

In FIG. 6, the case where the second inclination angle $\theta 2$ of second protection layer 720 is about 10 degree is shown to show the shape of the bending state of the first third part P3-1, and the first inclination angle $\theta 1$ of the first protection layer 710 may be greater than about 10 degrees.

Referring back to FIG. 5 along with Table 1, the fourth part P4 of the substrate 100 has strain of 0.21%, 0.25%, 0.29%, 0.29%, 0.28%, 0.22%, and 0.32% in the order of Comparative Example 1, Exemplary Embodiment 1 to Exemplary Embodiment 5, and Comparative Example 2. In the case of Comparative Example 1 and Exemplary Embodiment 1 to Exemplary Embodiment 5, the variation of the strain received by the fourth part P4 is not substantially great. In contrast, in the case of Comparative Example 2 where the inclination angles $\theta 1$ and $\theta 2$ of the protection layers 710 and 720 are about 10 degrees, the strain received by the fourth part P4 is rather increased to 0.32% compared with Comparative Example 1 and Exemplary Embodiment 1 to Exemplary Embodiment 5. Hereinafter, the fourth part P4 of Comparative Example 2 in FIG. 5 is referred to as the first fourth part P4-1.

Hereinafter, referring to FIG. 7, the bending state of the display device according to Comparative Example 2, particularly the first fourth part P4-1, will be described. FIG. 7 shows the bending state of the display device, in which the first inclination angle θ1 of the first protection layer 710 is about 10 degrees. Hereinafter, any repetitive detailed description of the same or like constituent elements as the constituent elements described above with reference to FIG. 1 to FIG. 3 will be omitted.

Referring to FIG. 7, as the strain received by the first fourth part P4-1 of the substrate 100 is increased to 0.32% as shown in FIG. 5, the substrate 100 may rise up near the first fourth part P4-1, compared to the case shown in FIG. 2. That is, when the first inclination angle θ1 of the first protection layer 710 is about 10 degrees, the first fourth part P4-1 of the substrate 100 may rise in the z-axis direction more than the horizontal position of the substrate 100 where the display unit 200 and the polarization layer 400 are disposed. That is, the first flat area F1 may not be maintained in the flat shape and may swing up in the z-axis direction in the part adjacent to the bending area BA. The part of the bending area BA adjacent to the second flat area F2 may swing up in the z-axis direction along with the second flat area F2.

In an exemplary embodiment of the display device of FIG. 2, both the first flat area F1 and the second flat area F2 are effectively maintained in the flat state, so that the display device may ensure stability even in the bending state.

In FIG. 7, the case where the first inclination angle θ1 of the first protection layer 710 is about 10 degrees is shown to show the shape in the bending state of the first fourth part P4-1, and the second inclination angle θ2 of the second protection layer 720 may be greater than about 10 degrees.

Although FIG. 6 and FIG. 7 are illustrated as separate comparative examples, when both the first inclination angle θ1 and the second inclination angle θ2 are about 10 degrees, FIG. 6 and FIG. 7 may be combined. That is, the first third part P3-1 of the substrate 100 may have the form shown in FIG. 6, and the first fourth part P4-1 of the substrate 100 may have the form shown in FIG. 7.

Referring back to FIG. 4 and FIG. 5 along with Table 1 described above, the strain of comparative examples and exemplary embodiments in Table 1 will hereinafter be summarized.

In Comparative Example 1, the first, second, third, and fourth parts P1, P2, P3, and P4 have the strain of 0.49%, 0.56%, 0.19%, and 0.21%, respectively. In Exemplary Embodiment 1, the first, second, third, and fourth parts P1, P2, P3, and P4 have the strain of 0.44%, 0.58%, 0.07%, and 0.25%, respectively. In Exemplary Embodiment 4, the first, second, third, and fourth parts P1, P2, P3, and P4 have the strain of 0.24%, 0.54%, 0.15%, and 0.28%, respectively. In Exemplary Embodiment 5, the first, second, third, and fourth parts P1, P2, P3, and P4 have the strain of 0.29%, 0.53%, 0.06%, and 0.22%.

In Exemplary Embodiment 1, even though the inclination angles θ1 and θ2 are about 90 degrees, since the protection layers 710 and 720 include the photo-hardening resins, the strain of the first part P1 and the third part P3 is reduced, which enables more stable bending than Comparative Example 1.

In Exemplary Embodiment 2 to Exemplary Embodiment 5, compared to Comparative Example 1, the strain received by the substrate 100 is substantially reduced, thereby effectively bending. Particularly, in the case of Exemplary Embodiment 4 (45 degrees) and Exemplary Embodiment 5 (30 degrees), the strain received by each part P1, P2, P3, and P4 of the substrate 100 is significantly reduced in comparison with Comparative Example 1.

In Comparative Example 2, the first, second, third, and fourth parts P1, P2, P3, and P4 have the strain of 0.12%, 0.40%, 1.5%, and 0.32%, respectively. The strain of the fourth part P4 is increased compared to Comparative Example 1, and the strain of the third part P3 exceeds the maximum strain (1.4%). In other words, if the inclination angles θ1 and θ2 become abruptly smooth at about 10 degrees, the strain becomes rather large.

Accordingly, in an exemplary embodiment, the first inclination angle θ1 and the second inclination angle θ2 may be greater than about 10 degrees or less than about 90 degrees, for example, about 30 degrees or greater to about 45 degrees or less.

When the protection layers 710 and 720 on the rear surface of the substrate 100 include the photo-hardening resin, as the inclination angles θ1 and θ2 of the protection layers 710 and 720 decreases, the strain received by the substrate 100 is reduced. Also, the variation received by the light-emitting element, the wiring, and the like of the display unit 200 disposed on the substrate 100 or the thin film transistor disposed in the non-display unit is reduced, thereby effectively preventing the damage thereof due to the strain of the substrate 100 by bending. That is, as the inclination of the protection layers 710 and 720 decreases, the strain of the substrate 100 decreases and the bending may be stably performed without damaging the display device.

However, when the inclination angles θ1 and θ2 of the protection layers 710 and 720 rapidly decrease by about 10 degrees (Comparative Example 2), the strains of the substrate 100, particularly the third part P3 and the fourth part P4 of the substrate 100, do not decrease, but rather increase, and as a result, the deformation of the substrate 100 is severe. As shown in Comparative Example 2, the strain of the third-first part P3-1 rapidly increases to 1.5% and the strain of the fourth-first part P4-1 also increases to 0.32%.

Therefore, in an exemplary embodiment, the inclination angles θ1 and θ2 of the protection layers 710 and 720 may be greater than about 10 degrees or less than about 90 degrees, for example, about 30 degrees or greater to 45 degrees or less.

According to an exemplary embodiment of the display device, as described above, by forming the end of the protection layers 710 and 720 of the substrate 100 rear surface to be inclined, the interference in the bending area BA may be minimized by facilitating the space clearance security in the bending area BA.

According to an exemplary embodiment, by adjusting the inclination angles θ1 and θ2 of the ends of the protection layers 710 and 720, the stress received by the bending area BA may be effectively controlled and the bending may be stable. In such an embodiment, as the slopes of the ends of the protection layers 710 and 720 are smoothed, the stress applied to the substrate 100 may be reduced during bending, and the strain may be reduced, thereby enabling the stable bending.

Next, alternative exemplary embodiments of the display device will be described with reference to FIG. 8 to FIG. 15. Hereinafter, any repetitive detailed description of similar or same constituent elements as the constituent elements described above with reference to FIG. 1 to FIG. 3 will be omitted.

Figure 8:
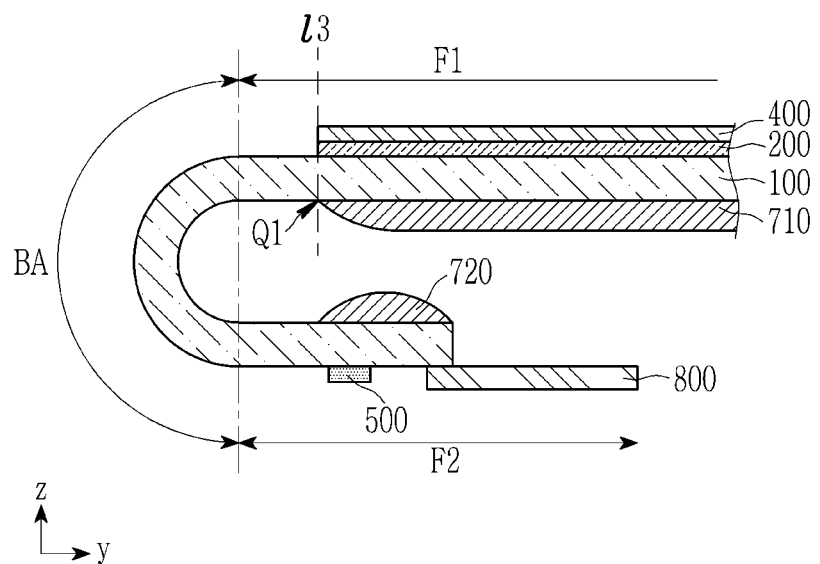
FIG. 8 is a schematic cross-sectional view of a display device according to an alternative exemplary embodiment.

Hereinafter, an exemplary embodiment of the display device, in which an alignment of the protection layer is modified, will be described with reference to FIG. 8. FIG. 8 is a schematic cross-sectional view of a display device according to an alternative exemplary embodiment.

Referring to FIG. 8, in an exemplary embodiment, the first inclination part 711 of the first protection layer 710 meets the substrate 100 at the first contact point Q1. In such an embodiment, the edge of the first protection layer 710 is disposed at the first contact point Q1. In such an embodiment, the edge of the first protection layer 710 may substantially coincide with the edge of the display unit 200 and the polarization layer 400. In such an embodiment, as shown in FIG. 8, the first contact point Q1 and the edge of the display unit 200 and the polarization layer 400 may be disposed on a same imaginary straight line 13 in a z-axis direction.

When the first protection layer 710 is formed through the printing process, the alignment of the first protection layer 710 may be easily controlled, thereby aligning the edge of the first protection layer 710 and the edge of the display unit 200. In an embodiment where the edge of the first protection layer 710 is aligned substantially in a same line as the edge of the display unit 200, an area occupied by a dead space or a bezel may be reduced.

Figure 9:
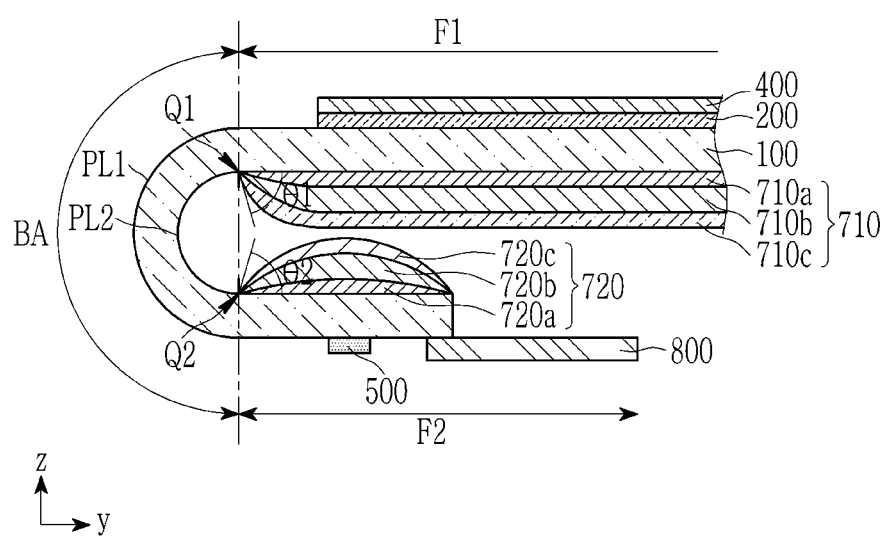
FIG. 9 is a schematic cross-sectional view of a display device according to another alternative exemplary embodiment.

Next, another alternative exemplary embodiment of the display device in which the protection layer has a multi-layered structure will be described with reference to FIG. 9 and FIG. 10. FIG. 9 is a schematic cross-sectional view of a display device according to another alternative exemplary embodiment, and FIG. 10 is a schematic cross-sectional view showing a state in which a substrate is unfolded in a display device according to an exemplary embodiment of FIG. 9.

Figure 10:
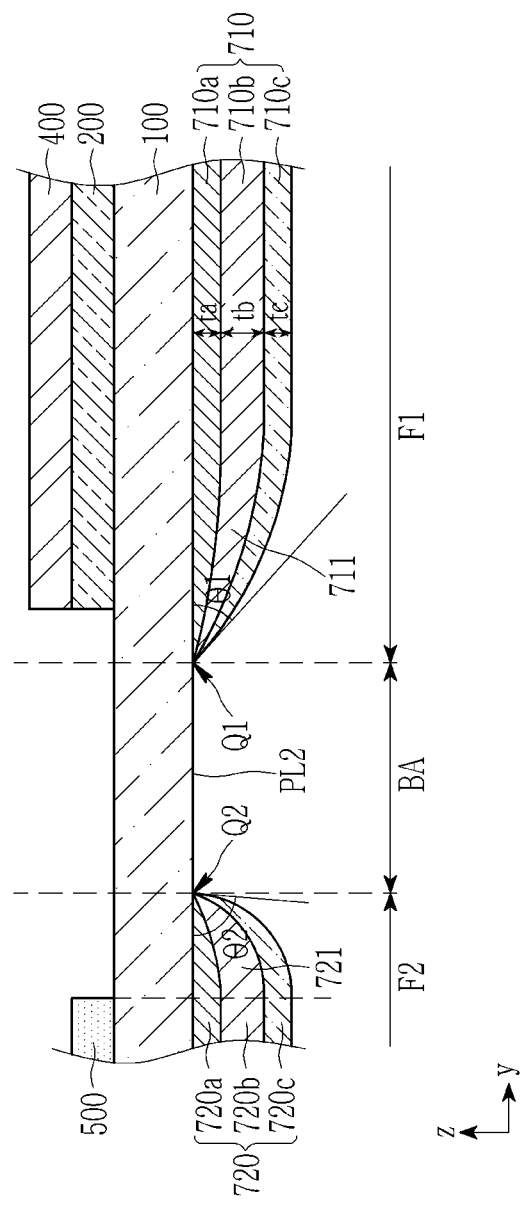
FIG. 10 is a schematic cross-sectional view showing a state in which a substrate is unfolded in a display device according to an exemplary embodiment of FIG. 9.

Referring to FIG. 9 and FIG. 10, in an exemplary embodiment, at least one of the first protection layer 710 and the second protection layer 720 may include a plurality of layers. In one exemplary embodiment, for example, the first and second protection layers (710 and 720) may include a first auxiliary layer (710a and 720a), a second auxiliary layer (710b and 720b), and a third auxiliary layer (710c and 720c), respectively. In an embodiment, as shown in FIG. 9, the first protection layer 710 and the second protection layer 720 respectively include the first auxiliary layer (710a and 720a), the second auxiliary layer (710b and 720b), and the third auxiliary layer (710c and 720c), but not being limited thereto. Alternatively, and only one of the first protection layer 710 and the second protection layer 720 may have a multi-layered structure.

Each of the first auxiliary layers 710a and 720a, the second auxiliary layers 710b and 720b, and the third auxiliary layers 710c and 720c may be formed through a separate printing process (for example, an Inkjet process).

The first auxiliary layers 710a and 720a, the second auxiliary layers 710b and 720b, and the third auxiliary layers 710c and 720c may include the hardening member of the photo-hardening resin, respectively. The hardening members of the photo-hardening resin may independently include photoinitiators, thermal stabilizers, antioxidants, antistatic agents or slip agents, for example.

Ends of the first auxiliary layer 710a, the second auxiliary layer 710b, and the third auxiliary layer 710c collectively define or form the first inclination part 711 of the first protection layer 710. Ends of the first auxiliary layer 720a, the second auxiliary layer 720b, and the third auxiliary layer 720c collectively define or form the second inclination part 721 of the second protection layer 720. The first inclination part 711 and the second inclination part 721 may have a shape inclined toward the back of the substrate 100, that is, the second surface PL2.

In an exemplary embodiment, the end of the first auxiliary layers 710a and 720a may have a shape covered by the end of the second auxiliary layers 710b and 720b and the third auxiliary layers 710c and 720c, and the end of the second auxiliary layer 710b and 720b may have a shape covered by the end of the third auxiliary layers 710c and 720c. In such an embodiment, the first auxiliary layers 710a and 720a, the second auxiliary layers 710b and 720b, and the third auxiliary layers 710c and 720c may be sequentially stacked.

The first inclination part 711 forms the edge at the first contact point Q1 disposed at the second surface PL2 of the substrate 100. That is, the first protection layer 710 meets the second surface PL2 of the substrate 100 at the first contact point Q1. The end adjacent to the bending area BA of the first protection layer 710 has the first inclination part 711 having the first inclination angle θ1. The first inclination angle θ1 is the angle that the first protection layer 710 forms with the substrate 100 at the first contact point Q1. The first inclination angle θ1 has a value that is greater than about 10 degrees and less than about 90 degrees. In one exemplary embodiment, for example, the first inclination angle θ1 may be about 30 degrees or greater to about 90 degrees or less.

The second inclination part 721 forms the edge at the second contact point Q2 disposed at the second surface PL2 of the substrate 100. That is, the second protection layer 720 meets the second surface PL2 of the substrate 100 at the second contact point Q2. The end adjacent to the bending area BA of the second protection layer 720 has the second inclination part 721 having the second inclination angle θ2. The second inclination angle θ2 is an angle between the second protection layer 720 and the substrate 100 at the second contact point Q2. The second inclination angle θ2 has a value of more than 10 degrees and less than 90 degrees. In one exemplary embodiment, for example, the second inclination angle θ2 may be 30 degrees or greater to 90 degrees or less.

The ends of the first auxiliary layers 710a and 720a, the second auxiliary layers 710b and 720b, and the third auxiliary layers 710c and 720c constituting the first inclination part 711 and the second inclination part 721 may have a smooth cross-section.

The first auxiliary layers 710a and 720a may be in contact with the second surface PL2 of the substrate 100.

The maximum thickness ta of the first auxiliary layers 710a and 720a may be in a range of about 5 μm to about 20 μm. If the maximum thickness ta of the first auxiliary layers 710a and 720a is less than about 5 μm, it may be difficult to provide the desired or effective level of adherence, and if the maximum thickness ta of the first auxiliary layers 710a and 720a is greater than about 20 μm, the thickness occupied by the protection layers 710 and 720 may increase.

The first auxiliary layers 710a and 720a may include at least one material selected from an acryl-based resin, butyl rubber, a vinyl acetate resin, an EVA resin, a natural rubber, nitriles, a silicate resin, a silicone rubber, and a styrene block polymer. The first auxiliary layers 710a and 720a may provide adherence for coupling between the substrate 100 and the first protection layer 710 and between the substrate 100 and the second protection layer 720.

The second auxiliary layers 710b and 720b are disposed between the first auxiliary layers 710a and 720a and the third auxiliary layers 710c and 720c.

The maximum thickness tb of the second auxiliary layers 710b and 720b may be in a range of about 45 μm to about 80 μm. If the maximum thickness tb of the second auxiliary layers 710b and 720b is less than about 45 μm, the first protection layer 710 and the second protection layer 720 have a difficulty in performing a function of protecting the substrate 100 or the display unit 200. If the maximum thickness tb of the second auxiliary layers 710b and 720b is greater than about 80 μm, the thickness occupied by the first protection layer 710 and the second protection layer 720 may be excessively great.

The second auxiliary layers 710b and 720b may include at least one material selected from the acrylate-based compounds including an acrylate-based polymer, polyurethane, and SiO. The second auxiliary layers 710b and 720b may enable the first protection layer 710 and the second protection layer 720 to have predetermined elasticity.

The thickness of the second auxiliary layers 710b and 720b may be greater than the thickness of the first auxiliary layers 710a and 720a and the third auxiliary layers 710c and 720c. The second auxiliary layers 710b and 720b may protect the substrate 100 or the display unit 200 from impurity.

The third auxiliary layers 710c and 720c are disposed above the second auxiliary layers 710b and 720b. The third auxiliary layers 710c and 720c are auxiliary layers disposed furthest from the second surface PL2 of the substrate 100.

The third auxiliary layers 710c and 720c include a heat dissipating material. The heat dissipating material may be a carbon composite material including at least one material selected from graphite, carbon nanotube ("CNT"), carbon fiber, and graphene. Graphite has desired characteristics such as high thermal conductivity and dispersibility, and low cost. Carbon nanotube has high electric conductivity, and high thermal conductivity may be obtained even by adding a small amount due to a large aspect ratio thereof.

The third auxiliary layers 710c and 720c as the heat dissipating material may include at least one material selected from a carbon composite material, a metal composite material including metal particles, and a ceramic composite material including a ceramic powder.

The metal composite material may include metal particles and polymers. The metal particles function to improve thermal conductivity. The metal particles may be any one of Al, Ag, Cu, and Ni, but not being limited thereto.

The ceramic composite material may include a ceramic powder and a polymer. The ceramic powder has heat conductivity, thereby performing a heat dissipating function. The ceramic powder may be any one of AlN, $Al_2O_3$, BN, SiC, and BeO, but not being limited thereto.

The heat dissipating material included in the third auxiliary layers 710c and 720c is not limited to the above-described materials.

The third auxiliary layers 710c and 720c may further include a dispersant. The dispersant allows the material included the third auxiliary layer (710c and 720c) to be present in a form of a powder. The dispersant may be a photo-hardening resin for dispersing. The dispersion photo-hardening resin may deteriorate the heat dissipating effect by acting as particles or impurities when carbon is aggregated together. Therefore, the dispersant may be added to distribute the particles independently, thereby maximizing the heat dissipating effect. According to an exemplary embodiment, the heat dissipating material itself may also function as the dispersant.

In an exemplary embodiment of the display device, the light-emitting element or the circuit board 800 generates heat during the operation to drive the display device. When the display device is used under a maximum load or for a long time, excessive heat generation may cause overheating of the electronic components of the display device, such that the display device may malfunction and be damaged. Accordingly, in an exemplary embodiment, the third auxiliary layers 710c and 720c may dissipate heat generated from the display device by including the heat dissipating material, and maximize the heat dissipating effect by further including the dispersant.

The maximum thickness tc of the third auxiliary layer (710c and 720c) may be in a range of about 10 μm to about 30 μm. If the maximum thickness tc of the third auxiliary layers 710c and 720c is less than about 10 μm, it may be difficult to perform the function of protecting the other auxiliary layers, and if the maximum thickness tc of the third auxiliary layers 710c and 720c is greater than about 30 μm, the thickness of the first protection layer 710 and the second protection layer 720 may be excessively great.

Figure 11:
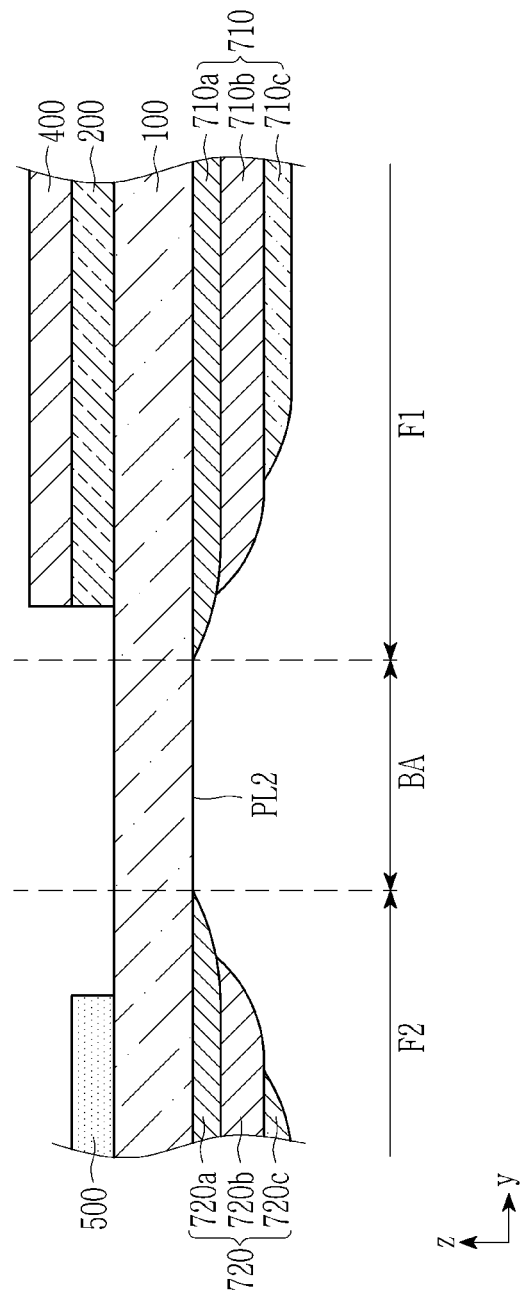
FIG. 11 is a schematic cross-sectional view of a display device according to another alternative exemplary embodiment.

Next, another alternative exemplary embodiment the display device will be described with reference to FIG. 11. FIG. 11 is a schematic cross-sectional view of a display device according to another alternative exemplary embodiment. Specifically, FIG. 11 shows an exemplary embodiment in which the protection layer has a multi-layered structure and the alignment of each auxiliary layer is modified.

Referring to FIG. 11, each end of the first auxiliary layers 710a and 720a, the second auxiliary layers 710b and 720b, and the third auxiliary layers 710c and 720c may be different from that shown in FIG. 10.

The end of the first auxiliary layers 710a and 720a may be exposed by the second auxiliary layers 710b and 720b and the third auxiliary layers 710c and 720c, and the end of the second auxiliary layers 710b and 720b may be exposed by the third auxiliary layers 710c and 720c.

The end of the first auxiliary layers 710a and 720a, the second auxiliary layers 710b and 720b, and the third auxiliary layers 710c and 720c may have a smooth step shape, for example. In such an embodiment, the ends of the first auxiliary layer 710a and 720a, the second auxiliary layer 710b and 720b, and the third auxiliary layer 710c and 720c may not be aligned with each other. Each end of the first auxiliary layers 710a and 720a, the second auxiliary layers 710b and 720b, and the third auxiliary layers 710c and 720c may be disposed far from the bending area in the order of the first auxiliary layers 710a and 720a, the second auxiliary layers 710b and 720b, and the third auxiliary layers 710c and 720c.

Figure 12:
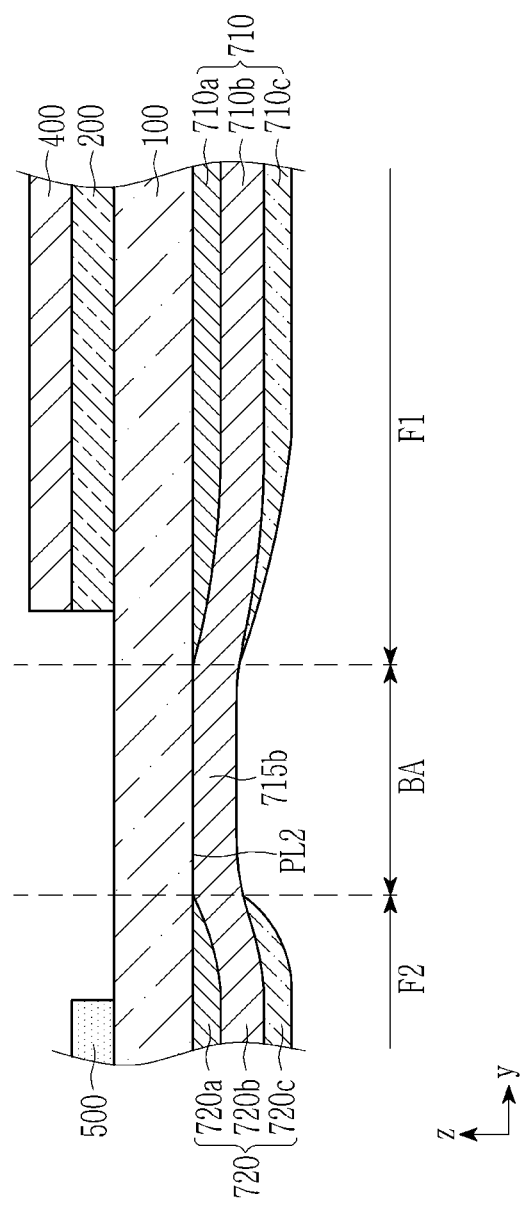
FIG. 12 is a schematic cross-sectional view of a display device according to another alternative exemplary embodiment.
Figure 14:
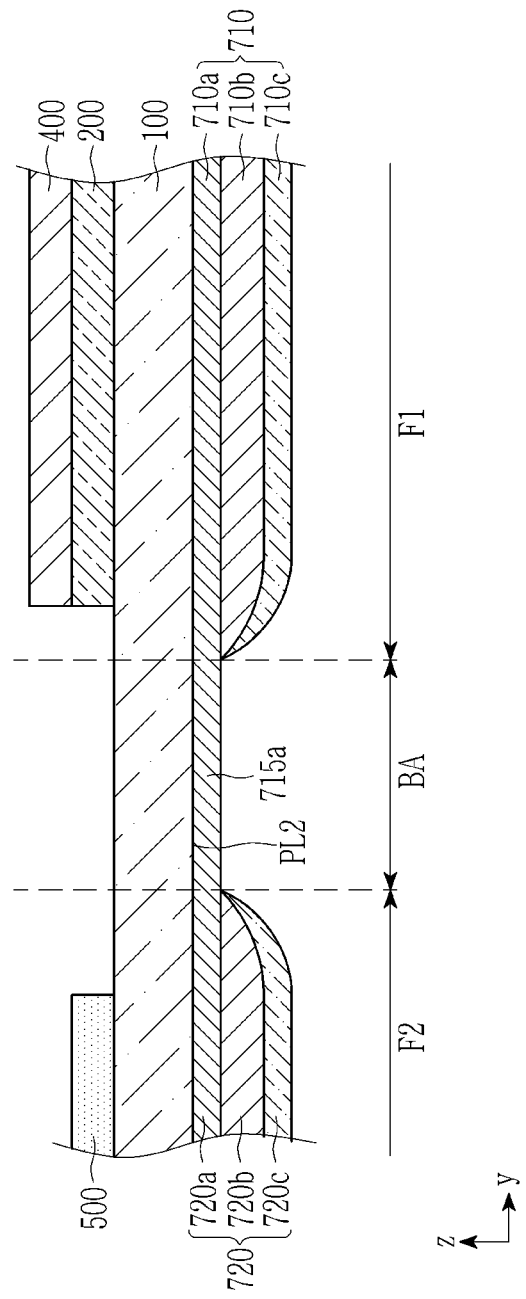
FIG. 14 is a schematic cross-sectional view of a display device according to another alternative exemplary embodiment.
Figure 15:
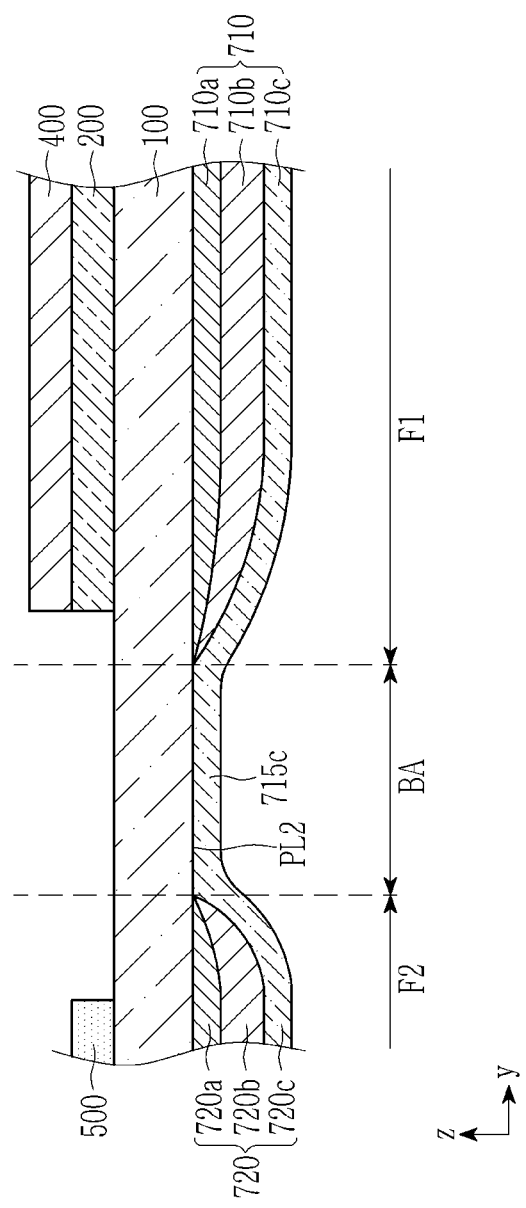
FIG. 15 is a schematic cross-sectional view of a display device according to another alternative exemplary embodiment.

Next, an exemplary embodiment in which the protection layer is formed in the bending area BA will be described with reference to FIG. 12 to FIG. 15. FIG. 12 is a schematic cross-sectional view of a display device according to another alternative exemplary embodiment, FIG. 13 is a cross-sectional view showing a state in which a substrate is folded in a display device according to an exemplary embodiment of FIG. 12, FIG. 14 is a schematic cross-sectional view of a display device according to another alternative exemplary embodiment, and FIG. 15 is a schematic cross-sectional view of a display device according to another alternative exemplary embodiment.

Figure 13:
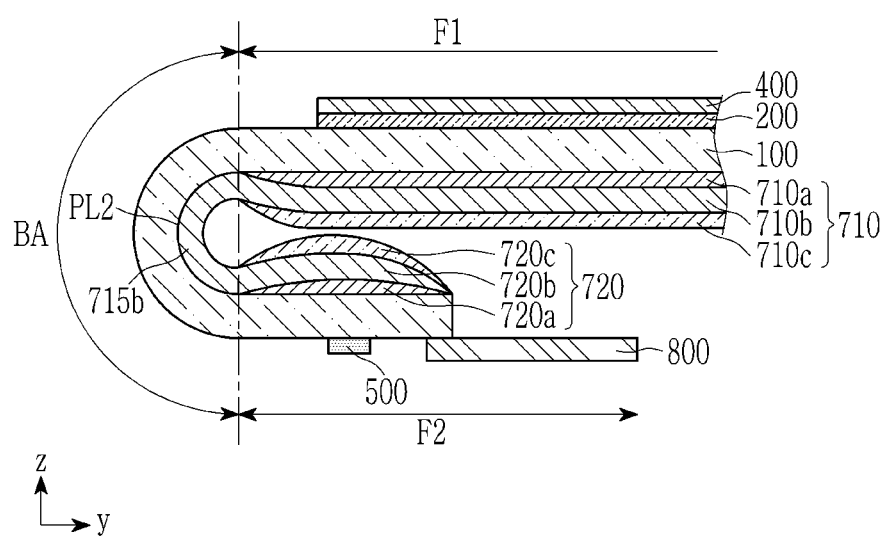
FIG. 13 is a cross-sectional view showing a state in which a substrate is folded in a display device according to an exemplary embodiment of FIG. 12.

In an exemplary embodiment, referring to FIG. 12 and FIG. 13, the second auxiliary layer 710b included in the first protection layer 710 and the second auxiliary layer 720b included in the second protection layer 720 may be connected to each other. The connected part is referred to as a second connection part 715b, and the second connection part 715b may be disposed on the second surface PL2 of the substrate 100 at the bending area BA. The second auxiliary layer 710b included in the first protection layer 710, the second connection part 715b, and the second auxiliary layer 720b included in the second protection layer 720 may be integrally formed as a single unitary unit, thereby forming a same layer. In such an embodiment, the second connection part 715b includes a same material as the second auxiliary layers 710b and 720b. The second auxiliary layers 710b and 720b and the second connection part 715b may be formed during a same process.

Referring to FIG. 13, by disposing the second connection part 715b in the bending area BA to provide elasticity to the substrate 100 during the bending of the display device, the bending may be flexible and the damage to the display device may be effectively prevented. In addition, the inflow of impurities to the substrate 100 may be effectively prevented.

FIG. 12 and FIG. 13 show an exemplary embodiment including the second connection part 715b integrally formed as a single unitary unit with the second auxiliary layers 710b and 720b. According to an exemplary embodiment, as shown in FIG. 14 and FIG. 15 to be described, the connection part including at least one of a first connection part 715a and a third connection part 715c may be disposed at the bending area BA.

Referring to FIG. 14, in an alternative exemplary embodiment, the first auxiliary layer 710a included in the first protection layer 710 and the first auxiliary layer 720a included in the second protection layer 720 may be connected to each other. The connected part is referred to as the first connection part 715a, and the first connection part 715a may be disposed on the second surface PL2 of the substrate 100 in the bending area BA. The first auxiliary layer 710a included in the first protection layer 710 and the first auxiliary layer 720a included in the second protection layer 720 may be integrally formed as a single unitary unit, thereby forming a same layer. In such an embodiment, the first connection part 715a includes the same material as the first auxiliary layers 710a and 720a. The first auxiliary layers 710a and 720a and the first connection part 715a may be formed in a same process.

Referring to FIG. 15, the third auxiliary layer 710c included in the first protection layer 710 and the third auxiliary layer 720c included in the second protection layer 720 may be connected to each other. The connected part is referred to as the third connection part 715c, and the third connection part 715c may be disposed on the second surface PL2 of the substrate 100 in the bending area BA. The third auxiliary layer 710c included in the first protection layer 710 and the third auxiliary layer 720c included in the second protection layer 720 may be integrally formed as a single unitary unit, thereby forming a same layer. That is, the third connection part 715c includes a same material as the third auxiliary layers 710c and 720c. The third auxiliary layers 710c and 720c and the third connection part 715c may be formed in a same process.

According to an exemplary embodiment, as shown in FIG. 12 to FIG. 15, the connection part including at least one material selected from the first connection part 715a, the second connection part 715b, and the third connection part 715c may be disposed in the bending area BA. The connection part disposed in the bending area BA may have a single layered or multi-layered structure. In such an embodiment, at least one auxiliary layer is disposed in the bending area BA to prevent the inflow of the impurity to the substrate 100.

Next, the thin film transistor and the light-emitting element included in the display unit 200 are described with reference to FIG. 16. FIG. 16 is a cross-sectional view of a thin film transistor and a light-emitting element of a display unit according to an exemplary embodiment.

Figure 16:
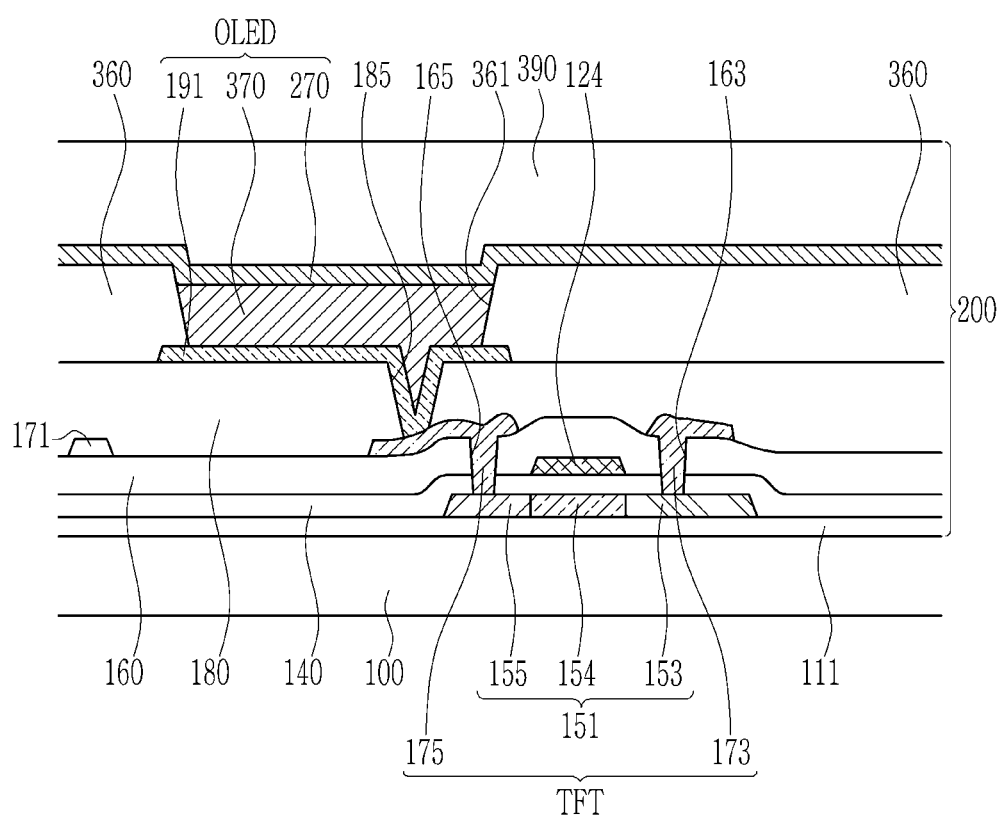
FIG. 16 is a cross-sectional view of a thin film transistor and a light-emitting element of a display unit according to an exemplary embodiment.

Referring to FIG. 16, in an exemplary embodiment of a display unit 200, a buffer layer 111 is disposed on the substrate 100. The buffer layer 111 may overlap an entire surface of the substrate 100. The buffer layer 111 may include an inorganic material such as a silicon oxide (SiOx), a silicon nitride (SiNx), or the like. The buffer layer 111 may be defined by a single layer or a plurality of layers.

The buffer layer 111 may provide a flat surface on one surface of the substrate 110 to planarize, and may effectively prevent an impurity degrading the characteristics of a later-described semiconductor layer 151 from being diffused and the penetration of moisture, etc. According to an alternative exemplary embodiment, the buffer layer 111 may be omitted.

The semiconductor layer 151 of the thin film transistor TFT is disposed on the buffer layer 111. The semiconductor layer 151 includes a channel area 154, and a source area 153 and a drain area 155 disposed at respective sides of the channel area 154.

The semiconductor layer 151 may include a polysilicon, an amorphous silicon, or an oxide semiconductor.

A gate insulating layer 140 is disposed on the semiconductor layer 151. The gate insulating layer 140 may be disposed to overlap the entire surface of the substrate 100.

The gate insulating layer 140 may include an inorganic insulating material such as a silicon oxide (SiOx), a silicon nitride (SiNx), or the like.

A gate conductor including a gate electrode 124 of the thin film transistor is disposed on the gate insulating layer 140. The gate electrode 124 may overlap the channel area 154 of the semiconductor layer 151.

An interlayer insulating layer 160 including the inorganic insulating material or the organic insulating material is disposed on the gate electrode 124.

In such an embodiment, a data conductor including a source electrode 173 and a drain electrode 175 of the thin film transistor TFT, a data line 171, a driving voltage line (not shown), etc., is disposed on the interlayer insulating layer 160. The source electrode 173 and the drain electrode 175 may be respectively connected to the source area 153 and the drain area 155 of the semiconductor layer 151 through contact holes 163 and 165 defined through the interlayer insulating layer 160 and the gate insulating layer 140.

The gate electrode 124, the source electrode 173, and the drain electrode 175 form the thin film transistor TFT together with the semiconductor layer 151. The thin film transistor TFT shown in FIG. 16 may be a driving transistor included in one pixel of an emissive display device. In an exemplary embodiment, as shown in FIG. 16, the thin film transistor TFT may be a top-gate transistor, in which the gate electrode 124 is disposed above the semiconductor layer 151. However, the structure of the thin film transistor TFT is not limited thereto and may be variously modified, and for example, the thin film transistor TFT may be a bottom-gate transistor in which the gate electrode is positioned under the semiconductor A planarization layer 180 is disposed on the interlayer insulating layer 160 and the data conductor. The planarization layer 180 serves to remove and planarize a step in order to increase emission efficiency of an organic light-emitting element ("OLEO") to be formed thereon. The planarization layer 180 may overlap and cover the thin film transistor TFT.

A pixel electrode 191 is disposed on the planarization layer 180. The pixel electrode 191 may be connected to the drain electrode 175 of the thin film transistor TFT through a contact hole 185 defined through the planarization layer 180.

A partition wall 360 is disposed on the planarization layer 180 and the pixel electrode 191. The partition wall 360 may overlap the part of the pixel electrode 191, and an opening 361 is defined through the partition wall 360 to expose a part of the pixel electrode 191.

The partition wall 360 may include an organic insulating materials such as a polyimide, a polyacrylate, and a polyamide, but not being limited thereto.

An emission layer 370 is disposed on the pixel electrode 191. The emission layer 370 includes an emission area. The emission layer 370 may additionally include at least one area selected from a hole injection area, a hole transport area, an electron injection area, and an electron transport area.

The emission layer 370 may include an organic material that emits light of a primary color such as red, green, and blue. In an exemplary embodiment, the emission layer 370 may have a structure in which a plurality of organic materials emitting different colors of light are stacked. In such an embodiment, inorganic materials for emitting light such as red, green, and blue light may be included.

A common electrode 270 for transmitting a common voltage is disposed on the emission layer 370 and the partition wall 360.

The pixel electrode 191, the emission layer 370, and the common electrode 270 of each pixel form the light-emitting element of the OLED. In an exemplary embodiment, the pixel electrode 191 may be an anode, which is a hole injection electrode, and the common electrode 270 may be a cathode, which is an electron injection electrode. Alternatively, the pixel electrode 191 may be the cathode and the common electrode 270 may be the anode. Light is emitted when holes and electrons from the pixel electrode 191 and the common electrode 270 are injected into the light emission layer 370 and then excitons of which the injected holes and electrons are combined fall from an excited state to a ground state.

An encapsulation layer 390 may be disposed on the common electrode 270. The encapsulation layer 390 may include a plurality of inorganic layers, or has a structure in which an inorganic layer and an organic layer are alternately stacked.

According to an exemplary embodiment of the display device, in the protection layers 710 and 720, as the above-described third auxiliary layers 710c and 720c (referring to FIG. 9) include the heat dissipating material, the heat generated from the light-emitting element or the transistor may be dissipated to prevent damage to the display device.

Figure 17:
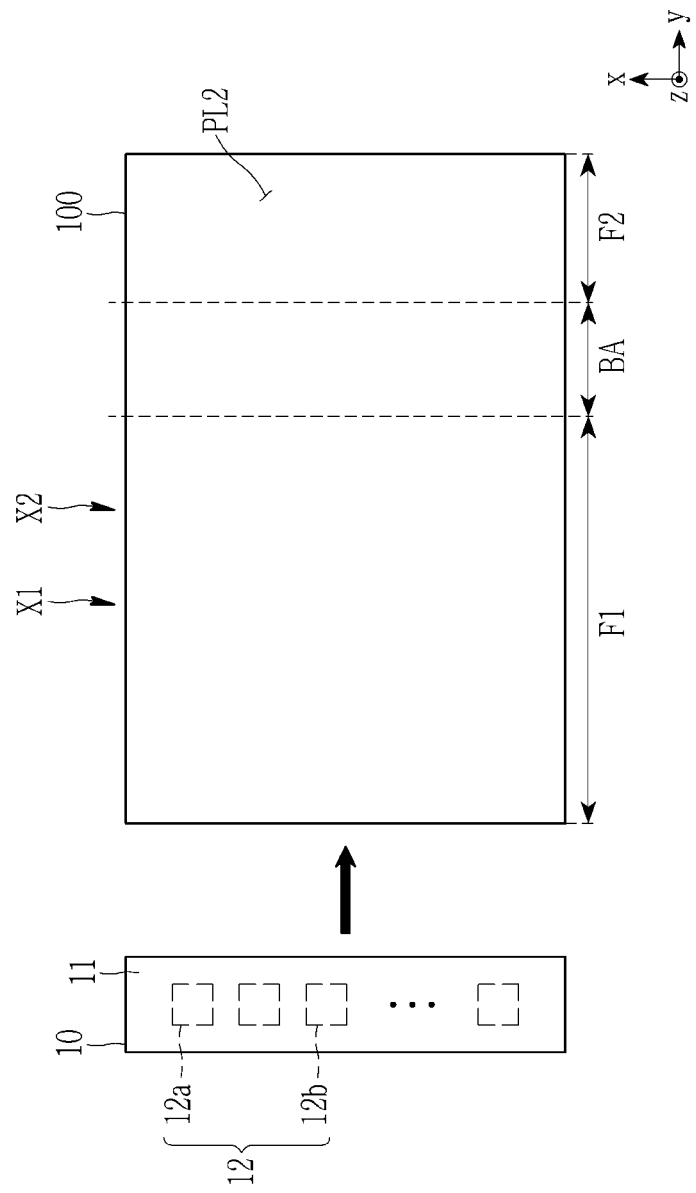
FIG. 17 is a schematic top plan view showing a manufacturing method of a display device according to an exemplary embodiment.

Next, an exemplary embodiment of a manufacturing method of the display device will be described with reference to FIG. 17 and FIG. 18. FIG. 17 is a schematic top plan view showing a manufacturing method of a display device according to an exemplary embodiment, and FIG. 18 is a schematic cross-sectional view showing a manufacturing method of a display device according to an exemplary embodiment.

Figure 18:
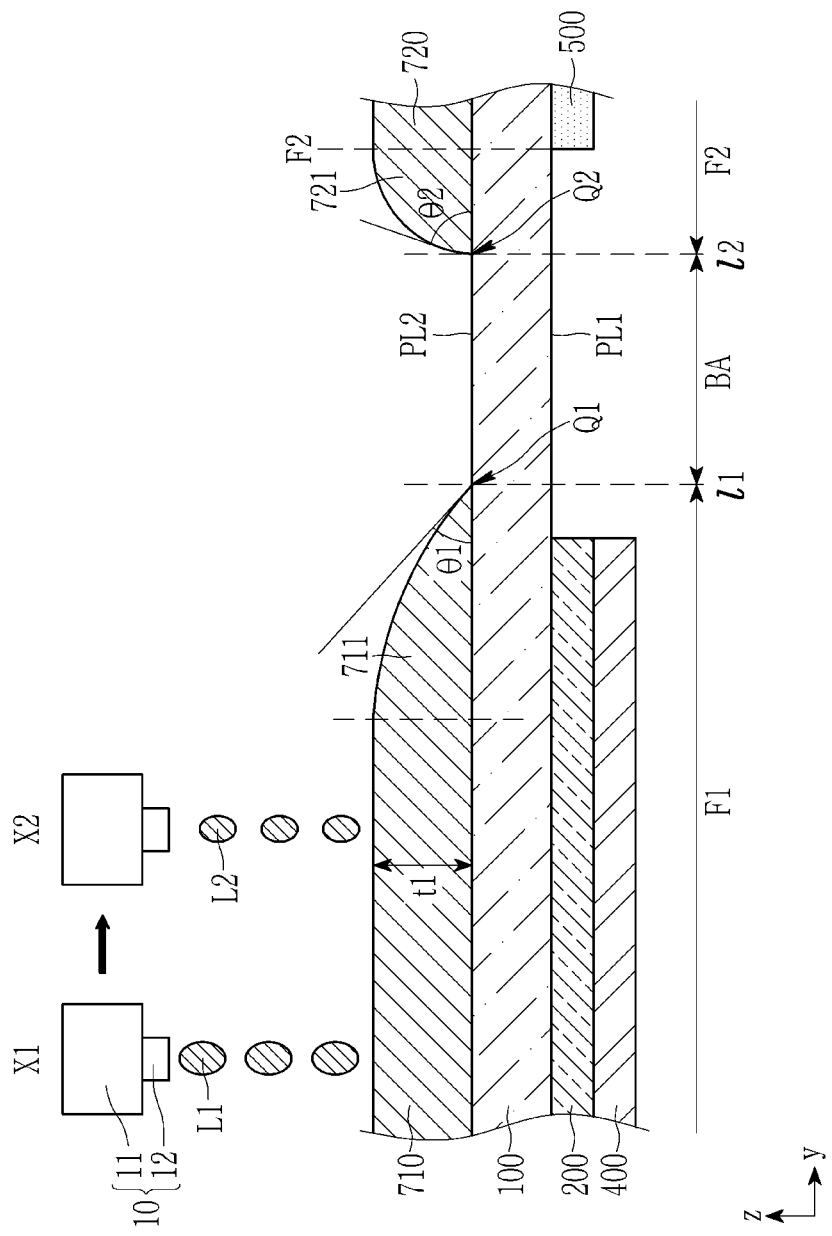
FIG. 18 is a schematic cross-sectional view showing a manufacturing method of a display device according to an exemplary embodiment.

Referring to FIG. 17 and FIG. 18, a top view of a printing device 10 and the substrate 100 viewed from the z-axis direction is shown. In FIG. 17, the visible portion of the substrate 100 is the back surface of the substrate 100, that is, the second surface PL2. Referring to FIG. 18, the printing device 10 and the substrate 100 are provided to be spaced at a predetermined interval in the z axis direction.

The printing device 10 coats a photo-hardening resin solution while passing the substrate 100 in the order of the first flat area F1, the bending area BA, and the second flat area F2. The coated photo-hardening resin solution is then cured with light (e.g., ultraviolet rays) to form the protection layers 710 and 720 on the second surface PL2 of the substrate 100. According to an exemplary embodiment, the printing device 10 may coat the photo-hardening resin solution while passing the substrate 100 in the order of the second flat area F2, the bending area BA, and the first flat area F1.

The printing device 10 include a head 11 and a nozzle 12 disposed under the head 11. The nozzle 12 may be a multi-nozzle including at least two nozzles having different sizes from each other. In one exemplary embodiment, for example, the nozzle 12 may include a first nozzle 12a and a second nozzle 12b having different sizes from each other.

Although not shown, the printing device 10 may further include a reservoir for storing the photo-hardening resin solution and connected to the nozzle 12.

In FIG. 17, one position of the first flat area F1 of the substrate 100 is referred to as a position X1. The position on the right other than the position X1 in the y-axis direction, that is, closer to the bending area BA, is referred to as a position X2. FIG. 18 shows a shape in which the printing device 10 performs the printing process at the position X1 and the position X2. Hereinafter, any repetitive detailed description of the same and similar constituent elements as the constituent elements described above with reference to FIG. 1 to FIG. 3 will be omitted.

Referring to FIG. 18, the printing device 10 sequentially coats the photo-hardening resin while moving from the position X1 to the position X2. The nozzle 12 of the printing device 10 may discharge droplets of the photo-hardening resin. The printing device 10 may discharge first droplets L1 to the second surface PL2 of the substrate 100 through the nozzle 12 at the position X1, and may discharge second droplets L2 to the second surface PL2 of the substrate 100 through the nozzle 12 at the position X2.

In such an embodiment, the nozzle 12 for discharging the first droplets L1 at the position X1 may be the first nozzle 12a, and the nozzle 12 for discharging the second droplets L2 at the position X2 may be the second nozzle 12b. Here, the size of the first nozzle 12a may be larger than the size of the second nozzle 12b, and the volume of the first droplets L1 may be larger than the volume of the second droplets L2. In such an embodiment, the first nozzle 12a may discharge droplets of a greater amount than the second nozzle 12b.

Accordingly, the first protection layer 710 is formed with a thinner thickness from the first flat area F1 toward the bending area BA, thereby forming the first inclination part 711. In such an embodiment, the first droplets L1 and the second droplets L2 that are discharged to the substrate 100 are combined and then form the first inclination part 711 while flowing to the bending area BA side.

According to an alternative exemplary embodiment, the sizes of the first nozzle 12a and the second nozzle 12b may be substantially the same as each other, but a number of the first nozzles 12a may be greater than that of second nozzles 12b to adjust the amount of the discharged droplets.

The first inclination part 711 of the first protection layer 710 formed through the above process has the first inclination angle $\theta1$ with the substrate 100 at the first contact point Q1 that meets the second surface PL2 of the substrate 100. The first inclination angle $\theta1$ has a value that is greater than about 10 degrees and less than about 90 degrees, for example, about 30 degrees or greater and about 45 degrees or less.

Although not shown separately, the printing device 10 may form the second protection layer 720 by an Inkjet process as the first protection layer 710. Even in the second flat area F2, the amount of the discharged droplet is lower when the printing device 10 is disposed at the side close to the bending area BA. Accordingly, the second protection layer 720 may have a thinner thickness from the second flat area F2 toward the bending area BA to form the second inclination part 721. In such an embodiment, the droplets discharged at each position of the second flat area F2 are combined with each other and flow toward the bending area BA to form the second inclination part 721.

The second inclination part 721 of the second protection layer 720 formed by the process has the second inclination angle $\theta2$ with the substrate 100 at the second contact point Q2 that meets the second surface PL2 of the substrate 100. The second inclination angle $\theta2$ has a value that is greater than about 10 degrees)(° and about 90 degrees or less, and may be, for example, about 30 degrees or greater and about 45 degrees or less Referring to FIG. 18, an upper protection film (not shown) may be attached on the substrate 100 on which the display unit 200 and the polarization layer 400 are disposed. After coating and curing the photo-hardening resin on the second surface PL2 of the substrate 100 to form the protection layers 710 and 720, the upper protection film (not shown) may be removed to provide the display device.

As described above, according to an exemplary embodiment of the manufacturing method (for example, the Inkjet process) of the display device, the inclination degree of the end of the protection layers 710 and 720 may be easily controlled by adjusting the amount of droplets of the photo-hardening resin discharged to the substrate 100 through the printing device 10. Accordingly, the bending may be facilitated by reducing the strain received by the substrate during bending and minimizing the interference between the protection layers 710 and 720.

In such an embodiment, the first protection layer 710 and the second protection layer 720 is formed by coating and curing the photo-hardening resin through the printing process (for example, the Inkjet process), selective patterning may be effectively performed, and accordingly, the manufacturing cost may be reduced and the process may be simplified.

While the invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate including a first flat area, a second flat area, and a bending area disposed between the first flat area and the second flat area;
a display unit overlapping the first flat area and disposed on a surface of the substrate;
a first protection layer disposed on an opposing surface of the substrate, which is opposite to the surface of the substrate, and overlapping the first flat area; and
a second protection layer disposed on the opposing surface of the substrate and overlapping the second flat area,
wherein the first protection layer and the second protection layer include a hardening member including a photo-hardening resin,
the first protection layer includes a first inclination part at an end thereof,
the second protection layer includes a second inclination part at an end thereof,
the first inclination part has a first inclination angle with the opposing surface of the substrate,
the second inclination part has a second inclination angle with the opposing surface of the substrate, and
each of the first inclination angle and the second inclination angle is greater than or equal to about 10 degrees and less than or equal to about 90 degrees.

2. The display device of claim 1, wherein
the first inclination angle and the second inclination angle are in a range of about 30 degrees to about 45 degrees.

3. The display device of claim 1, wherein
as the first inclination angle and the second inclination angle decrease, a strain received by the substrate at the bending area decreases.

4. The display device of claim 3, wherein:
a maximum value of the strain on one part of the substrate is about 1.4% during bending of the display device, and
a value of the strain is defined as: (strain length)/(initial length)×100(%).

5. The display device of claim 1, wherein
the first inclination part is disposed at a part where the first flat area is adjacent to the bending area, and
the second inclination part is disposed at a part where the second flat area is adjacent to the bending area.

6. The display device of claim 1, wherein
the photo-hardening resin includes at least one material selected from an acrylate-based compound including an acrylate-based polymer, a polyurethane, and SiO; and
the photo-hardening resin further includes at least one material selected from an acryl-based resin, a butyl rubber, a vinyl acetate resin, an ethylene vinyl acetate resin, a natural rubber, nitriles, a silicate resin, a silicone rubber and a styrene block polymer.

7. The display device of claim 1, wherein
each of the first protection layer and the second protection layer includes a first auxiliary layer, a second auxiliary layer and a third auxiliary layer, which are sequentially stacked one on another from the opposing surface of the substrate.

8. The display device of claim 7, wherein
the third auxiliary layer includes a heat dissipating material having heat conductivity.

9. The display device of claim 8, wherein
the heat dissipating material is a carbon composite material including at least one material selected from graphite, a carbon nanotube, a carbon fiber, and graphene.

10. The display device of claim 8, wherein
the third auxiliary layer further includes a dispersant including a dispersion photo-hardening resin.

11. The display device of claim 8, wherein:
the first auxiliary layer includes at least one material selected from an acryl-based resin, a butyl rubber, a vinyl acetate resin, an ethylene vinyl acetate resin, a natural rubber, nitriles, a silicate resin, a silicone rubber, and a styrene block polymer; and
the second auxiliary layer includes at least one material selected from an acrylate-based compound including an acrylate-based polymer, a polyurethane, and SiO.

12. The display device of claim 11, wherein
a connection part is disposed on the opposing surface of the substrate at the bending area, and the connection part includes a same material as the second auxiliary layer.

13. The display device of claim 1, wherein
the first protection layer and the second protection layer are spaced apart from each other, and
a space between the first protection layer and the second protection layer overlaps the bending area.

14. The display device of claim 1, wherein
the display device further includes a polarization layer disposed on the display unit,
the display device further includes a driving unit overlapping the second flat area and disposed on the surface of the substrate,
the first protection layer overlaps the display unit and the polarization layer, and
the second protection layer overlaps the driving unit.

15. A display device comprising:
a substrate including a first flat area, a second flat area, and a bending area disposed between the first flat area and the second flat area;
a display unit overlapping the first flat area and disposed on a surface of the substrate;
a first protection layer disposed on an opposing surface of the substrate, which is opposite to the surface of the substrate, and overlapping the first flat area; and
a second protection layer disposed on the opposing surface of the substrate and overlapping the second flat area,
wherein the first protection layer and the second protection layer include a hardening member including a photo-hardening resin,
the first protection layer includes a first inclination part having a first inclination angle at an end thereof,
the second protection layer includes a second inclination part having a second inclination angle at an end thereof, and
the first protection layer and the second protection layer include a heat dissipating material having heat conductivity.

16. The display device of claim 15, wherein
the first inclination angle and the second inclination angle are greater than or equal to about 10 degrees and less than or equal to about 90 degrees.

17. The display device of claim 15, wherein
the heat dissipating material is a carbon composite material including at least one material selected from graphite, a carbon nanotube, a carbon fiber, and graphene.

18. The display device of claim 15, wherein
the first protection layer and the second protection layer further include a dispersant including a dispersion photo-hardening resin.

\* \* \* \* \*